United States Patent
Mori et al.

(10) Patent No.: US 11,726,438 B2
(45) Date of Patent: Aug. 15, 2023

(54) TREATMENT CONDITION SETTING METHOD, STORAGE MEDIUM, AND SUBSTRATE TREATMENT SYSTEM

(71) Applicant: Tokyo Electron Limited, Tokyo (JP)

(72) Inventors: Takuya Mori, Tokyo (JP); Tadashi Nishiyama, Koshi (JP); Akiko Kiyotomi, Koshi (JP); Hiroshi Tomita, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 596 days.

(21) Appl. No.: 16/616,584

(22) PCT Filed: May 31, 2018

(86) PCT No.: PCT/JP2018/020940
§ 371 (c)(1),
(2) Date: Nov. 25, 2019

(87) PCT Pub. No.: WO2018/225615
PCT Pub. Date: Dec. 13, 2018

(65) Prior Publication Data
US 2020/0393803 A1 Dec. 17, 2020

(30) Foreign Application Priority Data

Jun. 5, 2017 (JP) ................ 2017-110817

(51) Int. Cl.
| | | |
|---|---|---|
| *G03F 7/38* | (2006.01) | |
| *G03F 7/20* | (2006.01) | |
| *G05B 19/042* | (2006.01) | |
| *H01L 21/67* | (2006.01) | |
| *G03F 7/34* | (2006.01) | |
| *G03F 7/16* | (2006.01) | |
| *H01L 21/027* | (2006.01) | |

(52) U.S. Cl.
CPC ............. *G05B 19/042* (2013.01); *G03F 7/20* (2013.01); *G03F 7/34* (2013.01); *G03F 7/38* (2013.01); *H01L 21/67225* (2013.01); *G03F 7/162* (2013.01); *G03F 7/168* (2013.01); *G05B 2219/2602* (2013.01); *H01L 21/027* (2013.01)

(58) Field of Classification Search
CPC ... G03F 7/38; G03F 7/40; G03F 7/162; G03F 7/70425
See application file for complete search history.

(56) References Cited

U.S. PATENT DOCUMENTS

2015/0324970 A1* 11/2015 Iwanaga ................... G06T 7/60
382/145

FOREIGN PATENT DOCUMENTS

| | | | |
|---|---|---|---|
| JP | 2000-269190 A | 9/2000 | |
| JP | 2003-158056 A | 5/2003 | |
| JP | 2007-177024 A | 7/2007 | |
| JP | 2008-270542 A | 11/2008 | |
| JP | 2017-022168 A | 1/2017 | |
| JP | 2017-028086 A | 2/2017 | |
| WO | WO2017/060054 | * 4/2017 | ............... G03F 7/20 |

OTHER PUBLICATIONS

International Search Report of the International Searching Authority dated Aug. 14, 2018 for the corresponding International patent application No. PCT/JP2018/020940 (and English translation).

* cited by examiner

*Primary Examiner* — Daborah Chacko-Davis
(74) *Attorney, Agent, or Firm* — Posz Law Group, PLC

(57) ABSTRACT

This method includes a step of imaging, by an imaging apparatus in a substrate treatment system, a reference substrate which is a reference for condition setting and acquiring a captured image of the reference substrate; and a step of imaging, by the imaging apparatus, a treated substrate on which the predetermined treatment has been performed under a current treatment condition and acquiring a captured image of the treated substrate. A deviation amount in color information between the captured image of the treated substrate and the captured image of the reference substrate is calculated. A correction amount of the treatment condition is calculated based on a correlation model acquired in advance and on the deviation amount in the color information. Also included is a step of setting the treatment condition based on the correction amount and performing the treatment on a target substrate based on the set treatment condition.

6 Claims, 12 Drawing Sheets

(A)　　　　　　　　　　　(B)

(C)　　　　　　　　　　　(D)

TREATMENT CONDITION SETTING METHOD, STORAGE MEDIUM, AND SUBSTRATE TREATMENT SYSTEM

TECHNICAL FIELD

Cross-Reference to Related Applications

This application is based upon and claims the benefit of priority of the prior Japanese Patent Application No. 2017-110817, filed in Japan on Jun. 5, 2017, the entire contents of which are incorporated herein by reference.

The present invention relates to a treatment condition setting method of setting a treatment condition of a predetermined treatment in a substrate treatment system including a treatment apparatus configured to perform the predetermined treatment on a substrate, a storage medium, and the substrate treatment system.

BACKGROUND ART

In photolithography steps in a manufacturing process of a semiconductor device, for example, a resist coating treatment of applying a resist solution onto, for example, a semiconductor wafer (hereinafter, referred to as a "wafer") to form a resist film, exposure processing of exposing the resist film to a predetermined pattern, a heat treatment of accelerating a chemical reaction in the resist film after the exposure (PEB (Post Exposure Bake treatment), a developing treatment of developing the exposed resist film and so on are performed in sequence, and a series of the wafer treatments forms a predetermined resist pattern on the wafer.

The heat treatment such as the above PEB treatment is generally performed in a thermal treatment apparatus having a hot plate for mounting and heating the wafer thereon. A heater of generating heat, for example, by power supply is embedded in the hot plate of the thermal treatment apparatus, and the hot plate is regulated to a predetermined temperature by the heat generation by the heater.

A thermal treatment temperature in the heat treatment greatly affects the line width of the resist pattern finally formed on the wafer. Hence, for strictly regulating the temperature within the wafer at the time of heating, the hot plate of the above-explained heat treatment apparatus is divided into a plurality of regions, and an individual heater is embedded in each of the regions, so that the temperature is regulated for each of the regions.

Further, it is known that if all of the treatment temperatures in the regions of the hot plate are made the same, the temperature within the wafer on the hot plate varies due to, for example, the difference in thermal resistance among the regions or the like and, as a result of this, the line width of the resist pattern finally varies. For this reason, the treatment temperature is individually set in each of the regions of the hot plate (refer to Patent Document 1).

PRIOR ART DOCUMENT

[Patent Document]
Patent Document 1: Japanese Laid-open Patent Publication No. 2007-177024

DISCLOSURE OF THE INVENTION

Problems to be Solved by the Invention

Incidentally, to set the treatment temperature in each of the regions of the hot plate, the line width of the resist pattern formed on the wafer has been conventionally measured for each of the regions and the treatment temperature has been regulated based on the measurement result. Further, for the measurement, a scanning electron microscope (SEM) has been used.

However, the SEM capable of measuring the line width of the resist pattern is expensive, and the line width measurement by the SEM takes time. In particular, to strictly set the above treatment temperature, the line width of the resist pattern needs to be measured at a plurality of places in each of the regions of the hot plate. In this case, the time required for measuring the line width further increases. Further, in the substrate treatment system for performing a series of photolithography steps, a plurality of thermal treatment apparatuses are installed to increase the productivity. In this case, the setting of the treatment temperature in each of the regions of the hot plate needs to be made for each of the thermal treatment apparatuses, so that much more time is required for the line width measurement needed for the regulation.

Patent Document 1 does not disclose nor suggest the above point.

Further, the aforementioned resist coating treatment is a treatment of supplying a resist solution to the wafer while rotating the wafer to form a resist film in a resist coating apparatus, and the treatment condition such as a treatment rotation speed of the wafer or the like is regulated in order to obtain the resist film having a desired film thickness. For this regulation, measurement of the film thickness of the resist film is performed, and a method of a cross section SEM is used for the measurement. In this method, it is necessary to break the wafer to produce a cross section sample. Accordingly, the measurement of the film thickness is burdensome and requires time. Further, a plurality of resist coating apparatuses are also provided in the substrate treatment system, and the treatment rotation speed of the wafer needs to be set for each of the resist coating apparatuses, requiring much more time for the measurement of the film thickness needed for the setting.

Not only the above-explained treatment temperature for each of the regions of the hot plate and the treatment rotation speed of the wafer but also the treatment condition of the film forming treatment and the treatment condition of the etching treatment have the same problems.

The present invention has been made in view of the above circumstances, and it is possible to set a treatment condition of a predetermined treatment in a substrate treatment system including a plurality of the same kind of treatment apparatuses for performing the predetermined treatment on a substrate at a low cost and in a short time, for each of the treatment apparatuses.

Means for Solving the Problems

An aspect of the present invention to solve the above problem is a treatment condition setting method of setting a treatment condition of a predetermined treatment in a substrate treatment system, the substrate treatment system including a plurality of treatment apparatuses each configured to perform the predetermined treatment on a substrate, the substrate treatment system including an imaging apparatus configured to image a surface side of the substrate, the treatment condition setting method including: imaging, by the imaging apparatus, a reference substrate being a substrate which is a reference for setting the treatment condition and acquiring a captured image of the reference substrate based on an imaging result; imaging, by the imaging apparatus, a treated substrate being a substrate on which the predetermined treatment has been performed under a current treatment condition and acquiring a captured image of the treated substrate based on an imaging result; calculating a deviation amount in color information between the captured image of the treated substrate and the captured image of the reference substrate; calculating a correction amount of the treatment condition of the predetermined treatment based on a correlation model indicating a correlation between a change amount in the color information in the captured image of the substrate based on the imaging result by the imaging apparatus and a change amount in the treatment condition and on the deviation amount in the color information; and setting the treatment condition of the predetermined treatment based on the calculated correction amount and on the current treatment condition, wherein the acquiring a captured image of the treated substrate, the calculating a deviation amount, the calculating a correction amount, and the setting are performed for each of the treatment apparatuses.

According to an aspect of the present invention according to another viewpoint is a computer-readable storage medium storing a program running on a computer of a controller configured to control a substrate treatment system so as to cause the substrate treatment system to execute the treatment condition setting method.

An aspect of the present invention according to still another viewpoint is a substrate treatment system including a plurality of treatment apparatuses each configured to perform a predetermined treatment on a substrate, the substrate treatment system including: an imaging apparatus configured to image a surface side of the substrate; and a controller configured to set a treatment condition of the predetermined treatment, the controller performing a control to execute: imaging, by the imaging apparatus, a reference substrate being a substrate which is a reference for setting the treatment condition and acquiring a captured image of the reference substrate based on an imaging result; imaging, by the imaging apparatus, a treated substrate being a substrate on which the predetermined treatment has been performed under a current treatment condition and acquiring a captured image of the treated substrate based on an imaging result; calculating a deviation amount in color information between the captured image of the treated substrate and the captured image of the reference substrate; calculating a correction amount of the treatment condition of the predetermined treatment based on a correlation model indicating a correlation between a change amount in the color information in the captured image of the substrate based on the imaging result by the imaging apparatus and a change amount in the treatment condition and on the deviation amount in the color information; and setting the treatment condition of the predetermined treatment based on the calculated correction amount and on the current treatment condition, wherein the acquiring a captured image of the treated substrate, the calculating a deviation amount, the calculating a correction amount, and the setting are performed for each of the treatment apparatuses.

Effect of the Invention

According to the present invention, it is possible to set a treatment condition of a predetermined treatment in a substrate treatment system including a plurality of the same kind of treatment apparatuses for performing the predetermined treatment on a substrate at a low cost and in a short time, for each of the treatment apparatuses.

EMBODIMENTS FOR CARRYING OUT THE INVENTION

Hereinafter, embodiments of the present invention will be explained. Note that in this description and the drawings, the same codes are attached to components having substantially the same functional configurations to omit duplicated explanation.

First Embodiment

Figure 1:
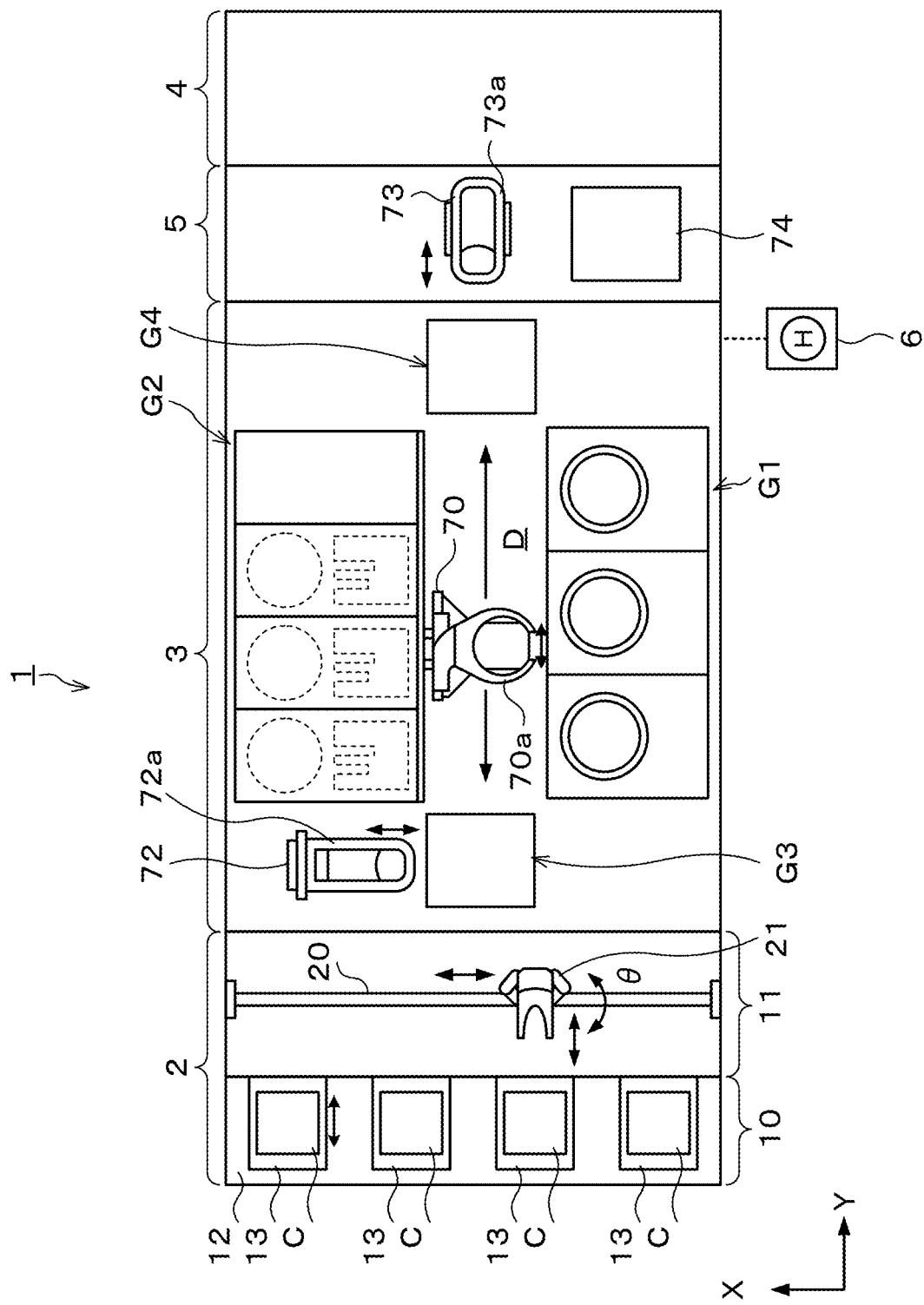
FIG. 1 is a plan view illustrating the outline of the configuration of a substrate treatment system according to a first embodiment of the present invention.
Figure 2:
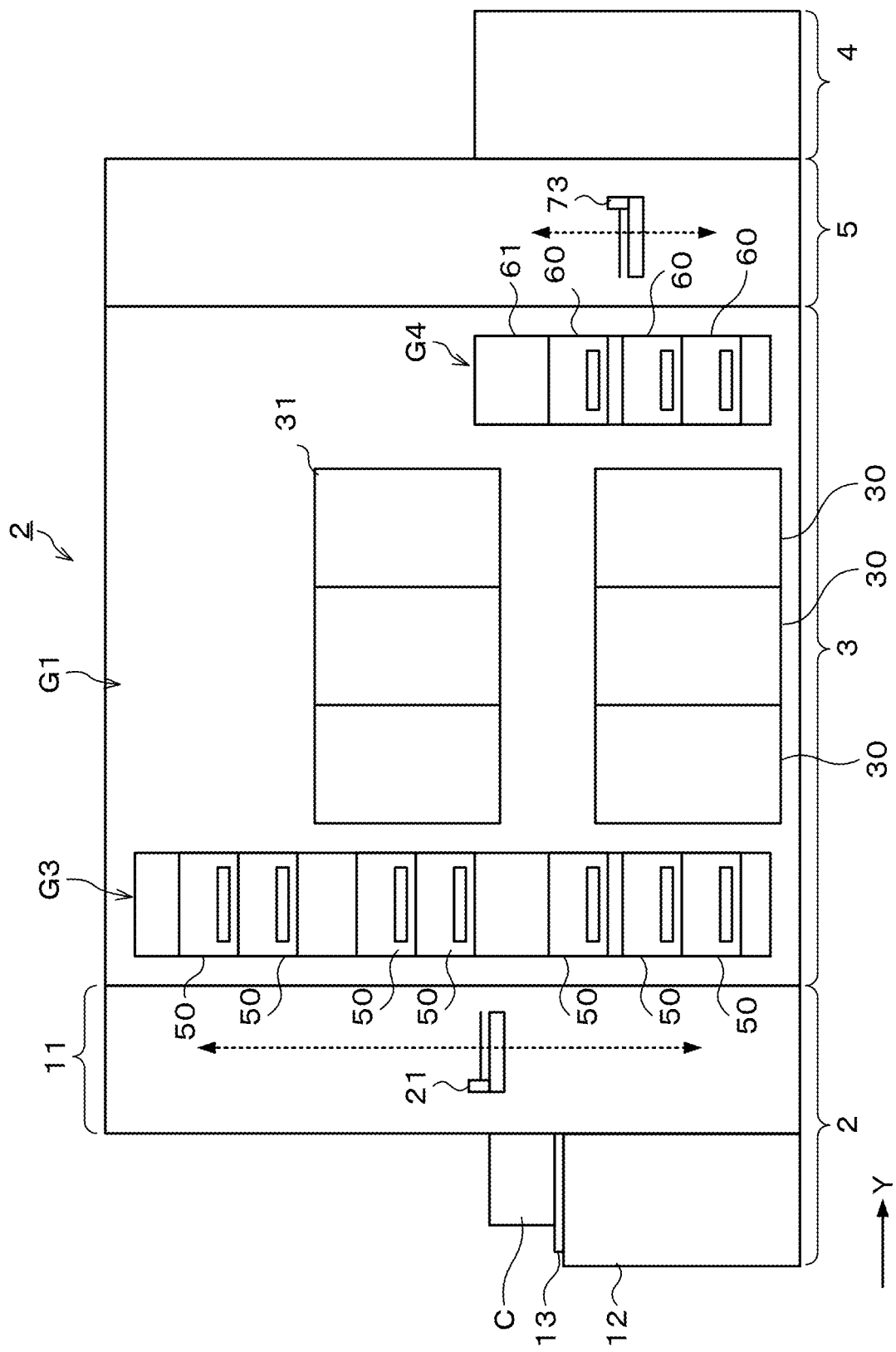
FIG. 2 is a front view illustrating the outline of the configuration of the substrate treatment system according to the first embodiment of the present invention.
Figure 3:
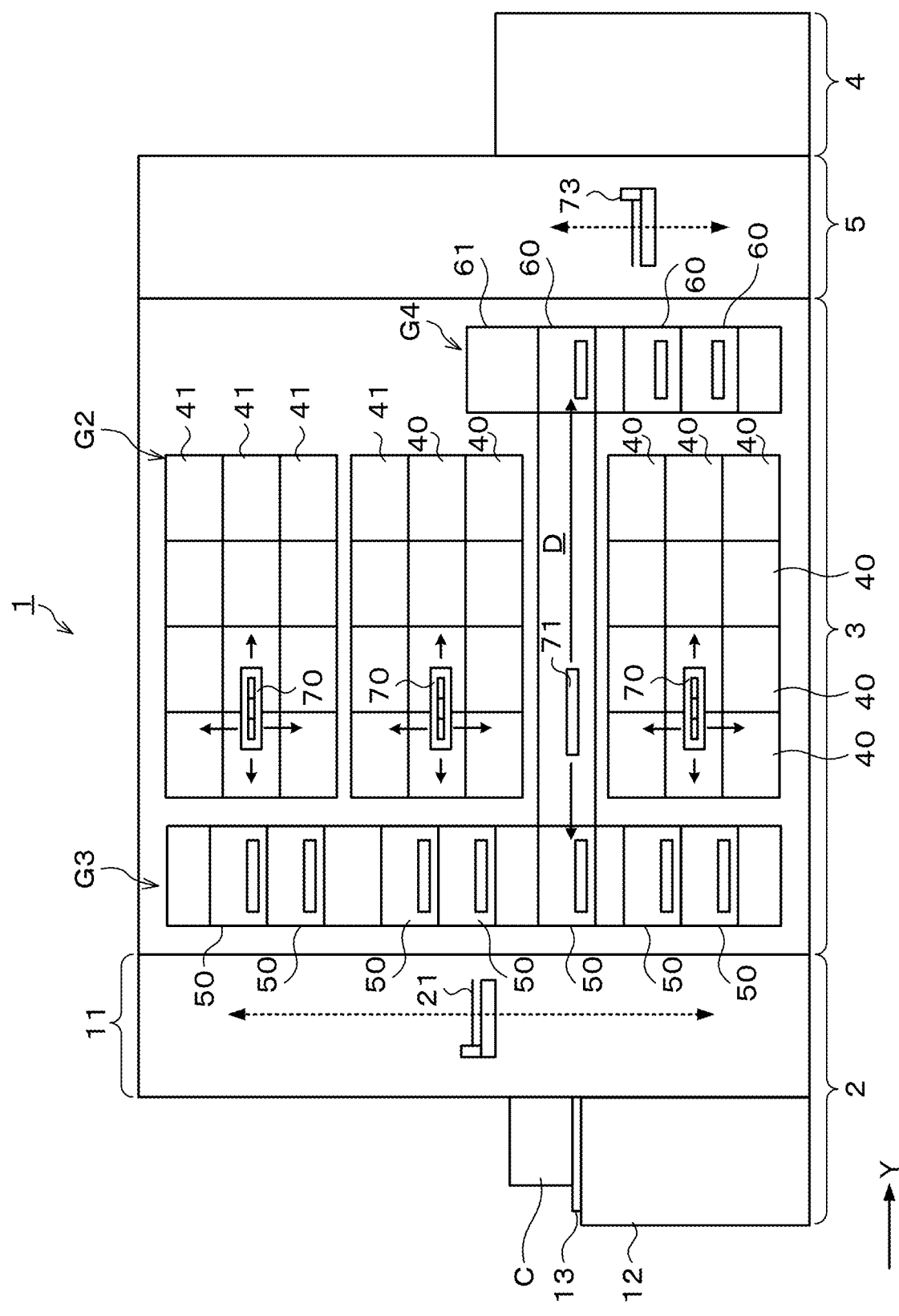
FIG. 3 is a rear view illustrating the outline of the configuration of the substrate treatment system according to the first embodiment of the present invention.

FIG. 1 is an explanatory view illustrating the outline of an internal configuration of a substrate treatment system 1 according to a first embodiment. FIG. 2 and FIG. 3 are a front view and a rear view illustrating the outline of the internal configuration of the substrate treatment system 1, respectively.

The substrate treatment system 1 has, as illustrated in FIG. 1, a configuration in which a cassette station 2 into/out of which a cassette C is transferred, for example, from/to the outside, a treatment station 3 including a plurality of various treatment apparatuses which perform predetermined treatments such as a resist coating treatment and PEB, and an interface station 5 which delivers the wafer W to/from an exposure apparatus 4 adjacent to the treatment station 3, are integrally connected. Further, the substrate treatment system 1 has a controller 6 which controls the substrate treatment system 1.

The cassette station 2 is divided, for example, into a cassette transfer in/out section 10 and a wafer transfer section 11. The cassette transfer-in/out section 10 is provided, for example, at an end on a Y-direction negative direction (left direction in FIG. 1) side of the substrate treatment system 1. In the cassette transfer-in/out section 10, a cassette stage 12 is provided. On the cassette stage 12, a plurality of, for example, four stage plates 13 are provided. The stage plates 13 are provided side by side in a row in an X-direction being a horizontal direction (an up-down direction in FIG. 1). On the stage plates 13, cassettes C can be mounted when the cassettes C are transferred in/out from/to the outside of the substrate treatment system 1.

In the wafer transfer section 11, a wafer transfer apparatus 21 is provided which is movable on a transfer path 20 extending in the X-direction as illustrated in FIG. 1. The wafer transfer apparatus 21 is movable also in an up-down direction and around a vertical axis (in a θ-direction), and can transfer the wafer W between the cassette C on each of the stage plates 13 and later-described delivery apparatuses included in a third block G3 in the treatment station 3.

In the treatment station 3, a plurality of, for example, four first to fourth blocks G1, G2, G3, G4 each including various apparatuses are provided. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (a Y-direction negative direction side in FIG. 1) in the treatment station 3, and the fourth block G4 is provided on the interface station 5 side (a Y-direction positive direction side in FIG. 1) in the treatment station 3.

In the first block G1, as illustrated in FIG. 2, a plurality of solution treatment apparatuses, for example, developing treatment apparatuses 30 each of which performs a developing treatment on the wafer W and resist coating apparatuses 31 each of which applies a resist solution to the wafer W to form a resist film are arranged in this order from the bottom.

For example, the developing treatment apparatus 30 and the resist coating apparatus 31 are arranged three each side by side in the horizontal direction. Note that the numbers and the arrangement of the developing treatment apparatuses 30 and the resist coating apparatuses 31 can be arbitrarily selected.

In each of the developing treatment apparatuses 30 and the resist coating apparatuses 31, spin coating of applying a predetermined treatment solution onto the wafer W is performed. In the spin coating, the treatment solution is discharged, for example, from a coating nozzle onto the wafer W and the wafer W is rotated to diffuse the treatment solution over the surface of the wafer W. Note that the configuration of the resist coating apparatus 31 will be explained later.

For example, in the second block G2, as illustrated in FIG. 3, thermal treatment apparatuses 40 each of which performs thermal treatments such as heating and cooling on the wafer W and edge exposure apparatuses 41 each of which exposes the outer peripheral portion of the wafer W are provided side by side in the vertical direction and in the horizontal direction. The numbers and the arrangement of the thermal treatment apparatuses 40 and the edge exposure apparatuses 41 can also be arbitrarily selected. Note that the configuration of the thermal treatment apparatus 40 will be explained later.

In the third block G3, a plurality of delivery apparatuses 50 are provided. Further, in the fourth block G4, a plurality of delivery apparatuses 60 are provided, and a defect inspection apparatus 61 is provided on them. Note that the configuration of the defect inspection apparatus 61 will be explained later.

A wafer transfer region D is formed in a region surrounded by the first block G1 to the fourth block G4 as illustrated in FIG. 1. In the wafer transfer region D, for example, a wafer transfer apparatus 70 is arranged.

The wafer transfer apparatus 70 has a transfer arm 70a movable, for example, in a Y-direction, a front-back direction, a θ-direction, and an up-down direction. The wafer transfer apparatus 70 can move in the wafer transfer region D to transfer the wafer W to a predetermined apparatus in the first block G1, the second block G2, the third block G3 and the fourth block G4 thereacround. A plurality of the wafer transfer apparatuses 70 are disposed one above the other, for example, as illustrated in FIG. 3, and each of them can transfer the wafer W, for example, to a predetermined apparatus at a height of the same level in each of the blocks G1 to G4.

Further, in the wafer transfer region D, a shuttle transfer apparatus 71 is provided which linearly transfers the wafer W between the third block G3 and the fourth block G4.

The shuttle transfer apparatus 71 is configured to be linearly movable, for example, in the Y-direction in FIG. 3. The shuttle transfer apparatus 71 can move in the Y-direction while supporting the wafer W, and transfer the wafer W between the delivery apparatus 50 in the third block G3 and the delivery apparatus 60 in the fourth block G4 which are at the height of the same level.

As illustrated in FIG. 1, a wafer transfer apparatus 72 is provided on the X-direction positive direction side of the third block G3. The wafer transfer apparatus 72 has a transfer arm 72a movable, for example, in the front-back direction, the θ-direction, and the up-down direction. The wafer transfer apparatus 72 can move up and down while supporting the wafer W to transfer the wafer W to each of the delivery apparatuses 50 in the third block G3.

In the interface station 5, a wafer transfer apparatus 73 and a delivery apparatus 74 are provided. The wafer transfer apparatus 73 has a transfer arm 73a movable, for example, in the Y-direction, the θ-direction, and the up-down direction. The wafer transfer apparatus 73 can transfer the wafer W to/from each of the delivery apparatuses 60 in the fourth block G4, the delivery apparatus 74, and the exposure apparatus 4, for example, while supporting the wafer W by the transfer arm 73a.

The aforementioned controller 6 is, for example, a computer including a program storage (not illustrated). In the program storage, a program for controlling the operations of the drive system in the above-explained various treatment apparatuses, the transfer apparatuses and so on to control processing for the wafer W including treatment condition setting processing in the substrate treatment system 1 is stored. Note that the program may be the one that is recorded, for example, in a computer-readable storage medium H such as a computer-readable hard disk (HD), flexible disk (FD), compact disk (CD), magneto-optical disk (MO), or memory card, and installed from the storage medium H into the controller 6.

Figure 4:
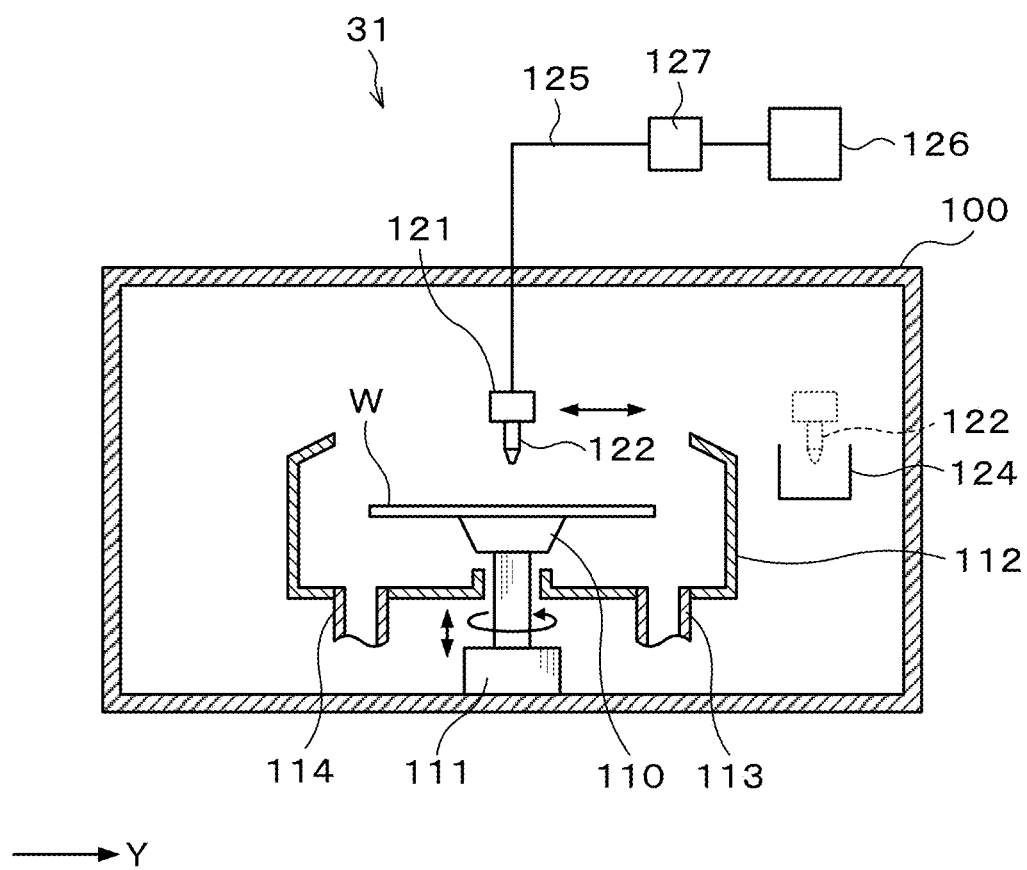
FIG. 4 is a longitudinal sectional view illustrating the outline of the configuration of a resist coating apparatus.
Figure 5:
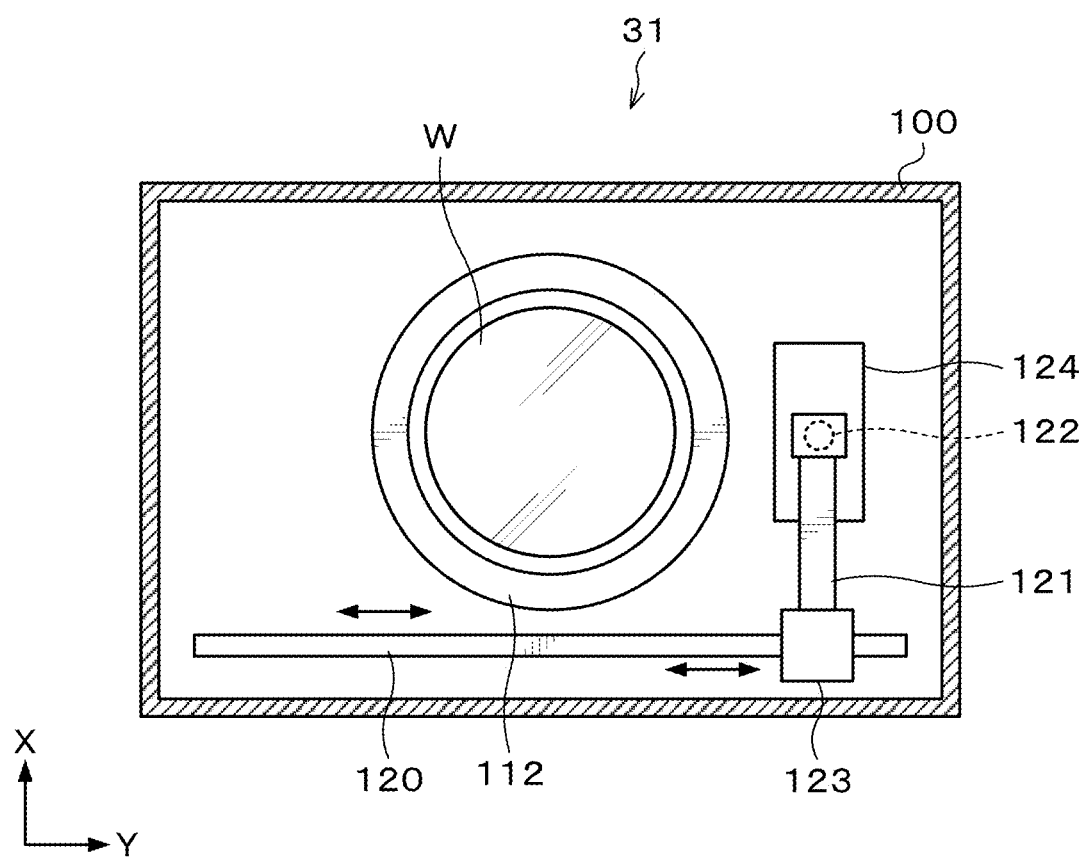
FIG. 5 is a transverse sectional view illustrating the outline of the configuration of the resist coating apparatus.

Next, the configuration of the aforementioned resist coating apparatus 31 will be explained. FIG. 4 and FIG. 5 are a longitudinal sectional view and a transverse sectional view illustrating the outline of the configuration of the resist coating apparatus 31.

The resist coating apparatus 31 has a treatment container 100 whose inside is sealable as illustrated in FIG. 4 and FIG. 5. A side surface on the wafer transfer apparatus 70 side of the treatment container 100 is formed with a transfer-in/out port (not illustrated) for the wafer W, and an opening and closing shutter (not illustrated) is provided at the transfer-in/out port.

At a center in the treatment container 100, a spin chuck 110 which holds and rotates the wafer W is provided. The spin chuck 110 has a horizontal upper surface, and the upper surface is provided with, for example, a suction port (not illustrated) for sucking the wafer W. By suction through the suction port, the wafer W can be suction-held on the spin chuck 110.

Below the spin chuck 110, a chuck drive 111 including, for example, a motor is provided. The spin chuck 110 can rotate at a predetermined speed by the chuck drive 111. Further, the chuck drive 111 is provided with, for example, a raising and lowering drive source such as a cylinder so that the spin chuck 110 freely rises and lowers.

Around the spin chuck 110, a cup 112 is provided which receives and collects liquid splashing or dropping from the wafer W. A drain pipe 113 which drains the collected liquid and an exhaust pipe 114 which evacuates and exhausts the atmosphere in the cup 112 are connected to the lower surface of the cup 112.

As illustrated in FIG. 5, on an X-direction negative direction (lower direction in FIG. 5) side of the cup 112, a rail 120 is formed which extends along a Y-direction (a right-left direction in FIG. 5). The rail 120 is formed, for example, from an outer position on the Y-direction negative direction (left direction in FIG. 5) side to an outer position on the Y-direction positive direction (right direction in FIG. 5) side of the cup 112. To the rail 120, an arm 121 is attached.

On the arm 121, a coating nozzle 122 which supplies the resist solution onto the wafer W is supported as illustrated in FIG. 4 and FIG. 5. The arm 121 is movable on the rail 120 by a nozzle drive 123 illustrated in FIG. 5. This allows the coating nozzle 122 to move from a waiting section 124 provided at an outer position on the Y-direction positive direction side of the cup 112 to a position above a center of the wafer W in the cup 112 and further move in a diameter direction of the wafer W above the wafer W. Further, the arm 121 is movable up and down by the nozzle drive 123, and is able to adjust the height of the coating nozzle 122.

To the coating nozzle 122, a supply pipe 125 is connected which supplies the resist solution to the coating nozzle 122 as illustrated in FIG. 4. The supply pipe 125 communicates with a resist solution supply source 126 which stores the resist solution therein. Further, the supply pipe 125 is provided with a supply equipment group 127 including a valve, a flow regulator and so on for controlling the flow of the resist solution.

Note that the configuration of the developing treatment apparatus 30 is the same as the configuration of the above-explained resist coating apparatus 31. However, the developing treatment apparatus 30 and the resist coating apparatus 31 are different in treatment solution to be supplied from the coating nozzle.

Figure 6:
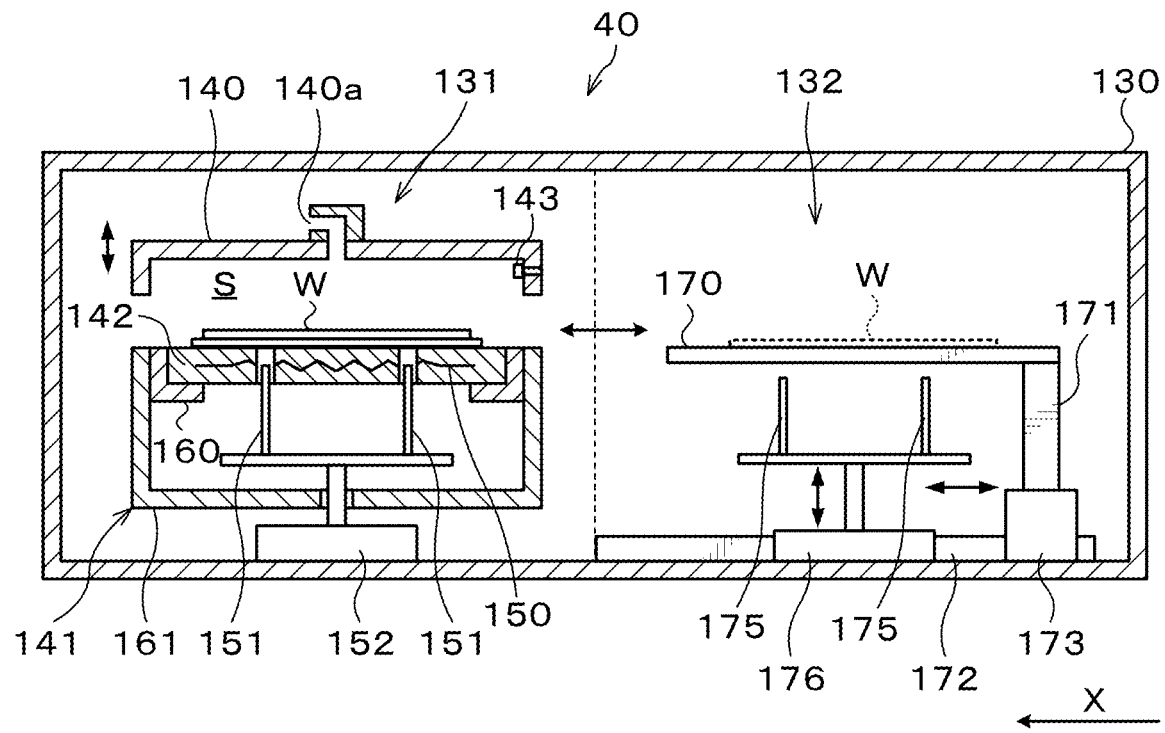
FIG. 6 is a longitudinal sectional view illustrating the outline of the configuration of a thermal treatment apparatus.
Figure 7:
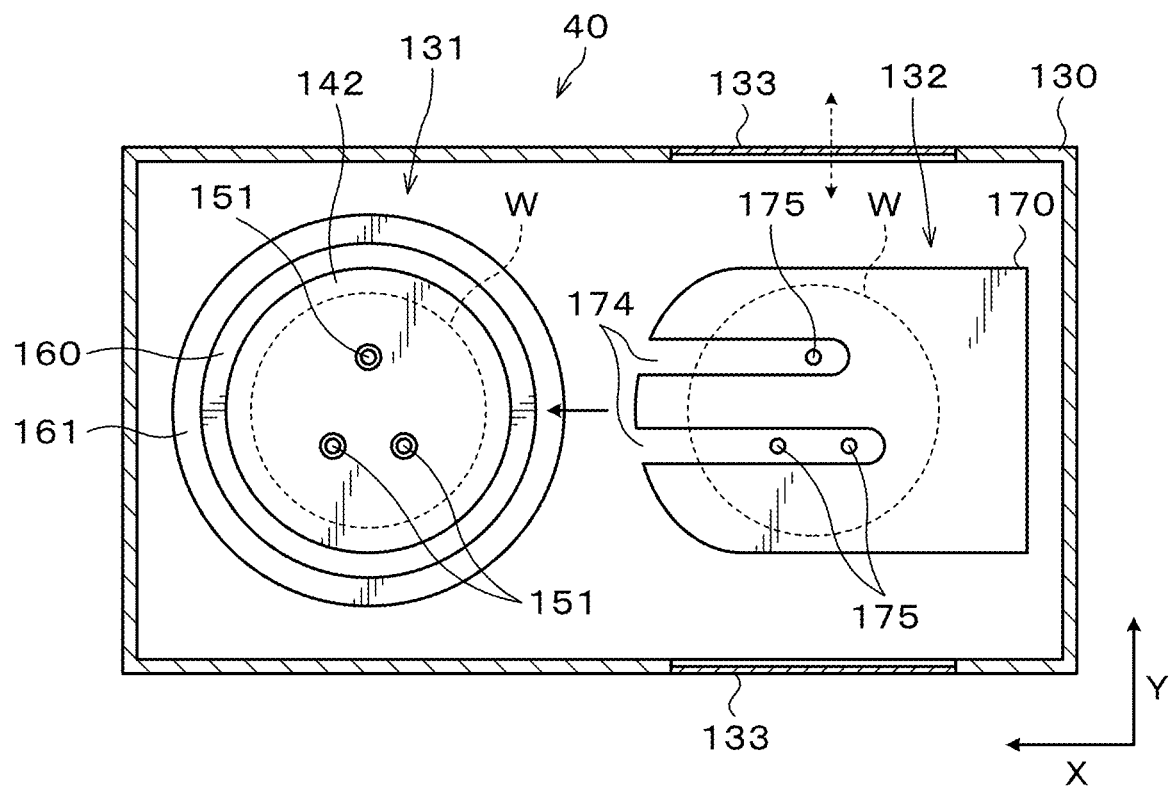
FIG. 7 is a transverse sectional view illustrating the outline of the configuration of the thermal treatment apparatus.

Subsequently, the configuration of the thermal treatment apparatus 40 will be explained. FIG. 6 and FIG. 7 are a longitudinal sectional view and a transverse sectional view illustrating the outline of the configuration of the thermal treatment apparatus 40.

The thermal treatment apparatus 40 includes, for example, a heating part 131 which performs a heat treatment on the wafer W and a cooling part 132 which performs a cooling treatment on the wafer W in a housing 130 as illustrated in FIG. 6 and FIG. 7. As illustrated in FIG. 7, both side surfaces near the cooling part 132 of the housing 130 are formed with transfer-in/out ports 133 for transferring in/out the wafer W.

The heating part 131 includes a lid 140 which is located on the upper side and movable up and down, and a hot plate accommodation part 141 which is located on the lower side and unites with the lid 140 to form a treatment chamber S as illustrated in FIG. 6.

The lid 140 has an almost cylindrical shape with a lower surface open, and covers an upper surface being a surface to be treated of the wafer W mounted on a later-explained hot plate 142. At the center of an upper surface of the lid 140, an exhaust part 140a is provided. The atmosphere inside the treatment chamber S is exhausted from the exhaust part 140a.

Further, the lid 140 is provided with a temperature sensor 143 being a temperature measurer which measures the temperature of the lid 140. The temperature sensor 143 is provided at an end portion of the lid 140 in the example of the drawing, but may be provided at a center or the like of the lid 140.

At the middle of the hot plate accommodation part 141, the hot plate 142 is provided on which the wafer W is mounted and which heats the mounted wafer W. The hot plate 142 has an almost disk shape with a large thickness, and a heater 150 which heats the upper surface of the hot plate 142, namely, a mounting surface for the wafer W is provided therein. As the heater 150, for example, an electric heater is used. The configuration of the hot plate 142 will be explained later.

In the hot plate accommodation part 141, raising and lowering pins 151 are provided which penetrate the hot plate 142 in the thickness direction. The raising and lowering pins 151 freely rise and lower by a raising and lowering drive 152 such as a cylinder and can project to above the upper surface of the hot plate 142 to deliver the wafer W to/from the later-explained cooling plate 170.

The hot plate accommodation part 141 has, for example, an annular holding member 160 which accommodates the hot plate 142 and holds the outer peripheral portion of the hot plate 142, and an almost cylindrical support ring 161 which surrounds the outer periphery of the holding member 160 as illustrated in FIG. 6.

In the cooling part 132 adjacent to the heating part 131, for example, the cooling plate 170 which mounts and cools the wafer W thereon is provided. The cooling plate 170 has an almost square flat plate shape being substantially a square, and has an end face on the heating part 131 side curved in an arc shape as illustrated in FIG. 7. The cooling plate 170 has a not-illustrated embedded cooling member such as a Peltier element or the like and can regulate the cooling plate 170 to a predetermined set temperature.

The cooling plate 170 is supported, for example, by a supporting arm 171 and the supporting arm 171 is attached to a rail 172 extending in the X-direction toward the heating part 131 side as illustrated in FIG. 6. The cooling plate 170 can move on the rail 172 by a drive mechanism 173 attached to the supporting arm 171. Thus, the cooling plate 170 can move to above the hot plate 142 on the heating part 131 side.

The cooling plate 170 is formed with, for example, two slits 174 along the X-direction in FIG. 7. The slits 174 are formed from the end face on the heating part 131 side of the cooling plate 170 to the vicinity of the middle of the cooling plate 170. The slits 174 can prevent interference between the cooling plate 170 moved to the heating part 131 side and the raising and lowering pins 151 above the hot plate 142. As illustrated in FIG. 6, below the cooling plate 170 located in the cooling part 132, raising and lowering pins 175 are provided. The raising and lowering pins 175 can rise and lower by a raising and lowering drive 176. The raising and lowering pins 175 can rise from below the cooling plate 170, pass through the slits 174, project to above the cooling plate 170, and deliver the wafer W, for example, to/from the wafer transfer apparatus 70 entering the inside of the housing 130 from the transfer-in/out port 133.

Figure 8:
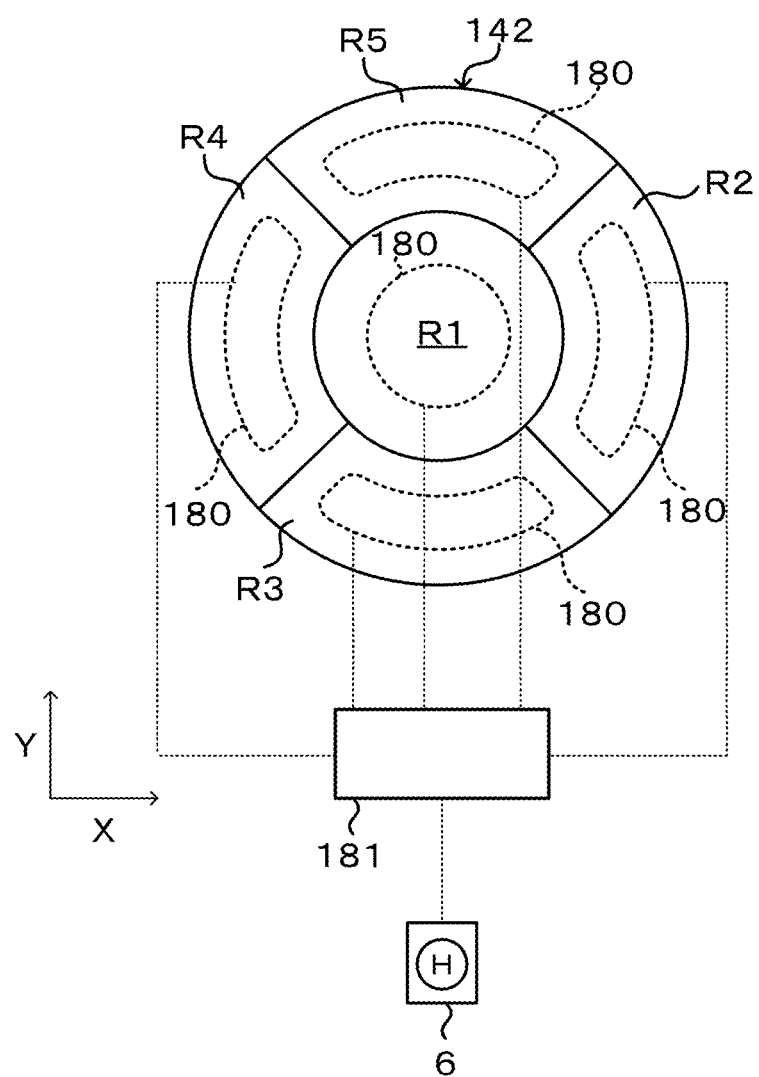
FIG. 8 is a plan view illustrating the outline of the configuration of a hot plate of the thermal treatment apparatus.

Next, the configuration of the hot plate 142 will be explained in detail. FIG. 8 is a plan view illustrating the outline of the configuration of the hot plate 142. The hot plate 142 is sectioned into a plurality of, for example, five hot plate regions (hereinafter, abbreviated as regions in some cases) R1 to R5 as illustrated in FIG. 8. The hot plate 142 is sectioned into the hot plate region R1 in a circular shape located, for example, at the center in a plan view, and the hot plate regions R2 to R5 obtained by equally dividing a surrounding area of the hot plate region R1 into four parts in arc shapes.

In each of the hot plate regions R1 to R5 of the hot plate 142, a heater 180 is individually embedded and can individually heat each of the hot plate regions R1 to R5. The heating value of the heater 180 in each of the hot plate regions R1 to R5 is regulated, for example, by a temperature controller 181. The temperature controller 181 can regulate the heating value of each of the heaters 180 to control the treatment temperature of each of the hot plate regions R1 to R5 to a predetermined set temperature. The temperature setting in the temperature controller 181 is performed by the controller 6.

Figure 9:
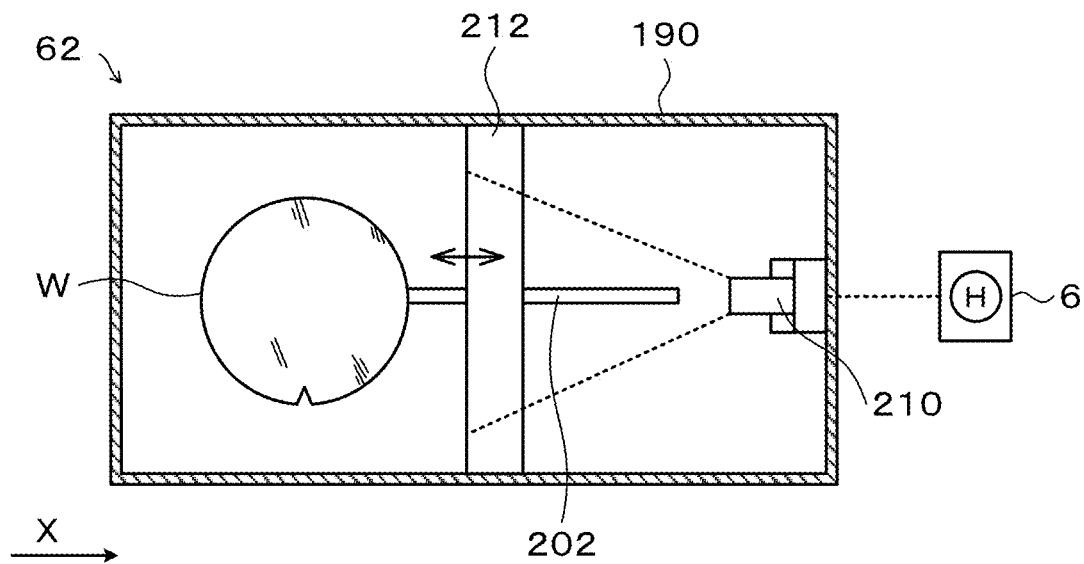
FIG. 9 is a longitudinal sectional view illustrating the outline of the configuration of a defect inspection apparatus.
Figure 10:
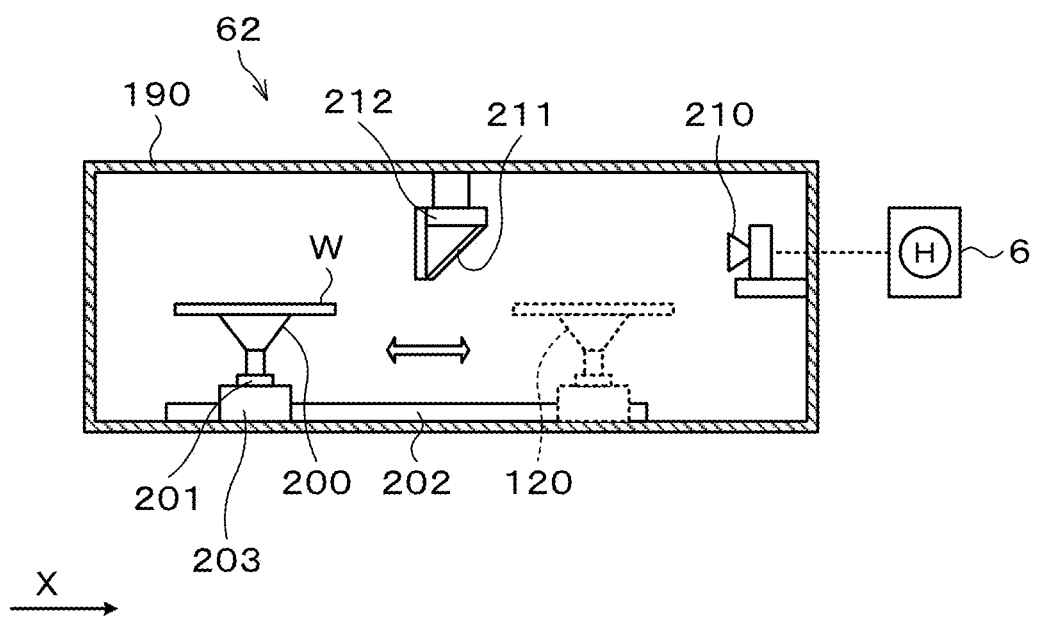
FIG. 10 is a transverse sectional view illustrating the outline of the configuration of the defect inspection apparatus.

Next, the configuration of the defect inspection apparatus 61 will be explained. FIG. 9 and FIG. 10 are a longitudinal sectional view and a transverse sectional view illustrating the outline of the configuration of the defect inspection apparatus 61, respectively. The defect inspection apparatus 61 has a casing 190 as illustrated in FIG. 9 and FIG. 10. In the casing 190, a stage 200 on which the wafer W is mounted is provided. The stage 200 freely rotates and stops by a rotation drive 201 such as a motor. At a bottom surface of the casing 190, a guide rail 202 is provided which extends from one end side (near an X-direction negative direction side in FIG. 10) to another end side (an X-direction positive direction side in FIG. 10) in the casing 190. The stage 200 and the rotation drive 201 are provided on the guide rail 202 and can move along the guide rail 202 by a drive apparatus 203.

On a side surface on the other end side (the X-direction positive direction side in FIG. 10) in the casing 190, an imaging apparatus 210 is provided. For the imaging apparatus 210, for example, a wide-angle CCD camera is used.

Near the middle of the top of the casing 190, a half mirror 211 is provided. The half mirror 211 is provided at a position facing the imaging apparatus 210 in such a state that its mirror surface is inclined upward at 45 degrees toward the imaging apparatus 210 from a state of being directed vertically downward. Above the half mirror 211, an illumination apparatus 212 is provided. The half mirror 211 and the illumination apparatus 212 are fixed to the upper surface in the casing 190. The illumination from the illumination apparatus 212 passes through the half mirror 211 and is applied downward. Accordingly, light reflected from an object existing below the illumination apparatus 212 is further reflected from the half mirror 211 and captured into the imaging apparatus 210. In other words, the imaging apparatus 210 can image the object existing within an irradiation region by the illumination apparatus 212.

Next, the wafer treatment using the substrate treatment system 1 will be explained.

In the wafer treatment using the substrate treatment system 1, first, the wafer W is taken out of the cassette C on the cassette stage 12 by the wafer transfer apparatus 21 and transferred to the delivery apparatus 50 in the treatment station 3.

Then, the wafer W is transferred by the wafer transfer apparatus 70 to the thermal treatment apparatus 40 in the second block G2 and subjected to a temperature regulation treatment. Thereafter, the wafer W is transferred to the resist coating treatment apparatus 31 in the first block G1, in which a resist film is formed on the wafer W. The wafer W is then transferred to the thermal treatment apparatus 40 and subjected to a pre-baking treatment (PAB: Pre-Applied Bake). Note that the similar thermal treatment is performed in the pre-baking treatment, PEB treatment and post-baking treatment at subsequent stages. However, the thermal treatment apparatuses 40 used for the thermal treatments are different from one another.

The wafer W is then transferred to the edge exposure apparatus 41 and subjected to edge exposure processing.

The wafer W is then transferred to the exposure apparatus 4 and subjected to exposure processing in a predetermined pattern.

The wafer W is then transferred to the thermal treatment apparatus 40 and subjected to a PEB treatment. The wafer W is then transferred, for example, to the developing treatment apparatus 30 and subjected to a developing treatment. After the developing treatment is finished, the wafer W is transferred to the thermal treatment apparatus 40 and subjected to a post-baking treatment. The wafer W is then transferred to the defect inspection apparatus 61, in which the defect inspection is performed on the wafer W. In the defect inspection, an inspection whether there is flaw or adhesion of foreign substance is performed. Then, the wafer W is transferred to the cassette C on the cassette stage 12, and a series of photolithography steps is completed.

Subsequently, a method of setting a treatment condition of the PEB treatment for forming resist patterns with a desired line width uniformly within a plane in introducing the substrate treatment system 1, specifically, a method of setting the treatment temperature in each of the regions R1 to R5 of the hot plate 142 at the time of the PEB treatment will be explained.

As explained above, it requires a long time to measure, by SEM, the line width of the resist pattern formed on the wafer W after the series of wafer treatments, and set the treatment temperature in each of the regions R1 to R5 of the hot plate 142 at the time of the PEB treatment based on the measurement result.

Hence, the present inventors have found, after the earnest studies, a correlation between the line width of the resist pattern on the wafer W and an imaging result using the imaging apparatus 210 of the defect inspection apparatus 61, and therefore arrived at the setting of the treatment temperature of the hot plate 142 at the time of the PEB treatment based on the imaging result.

Figure 11:
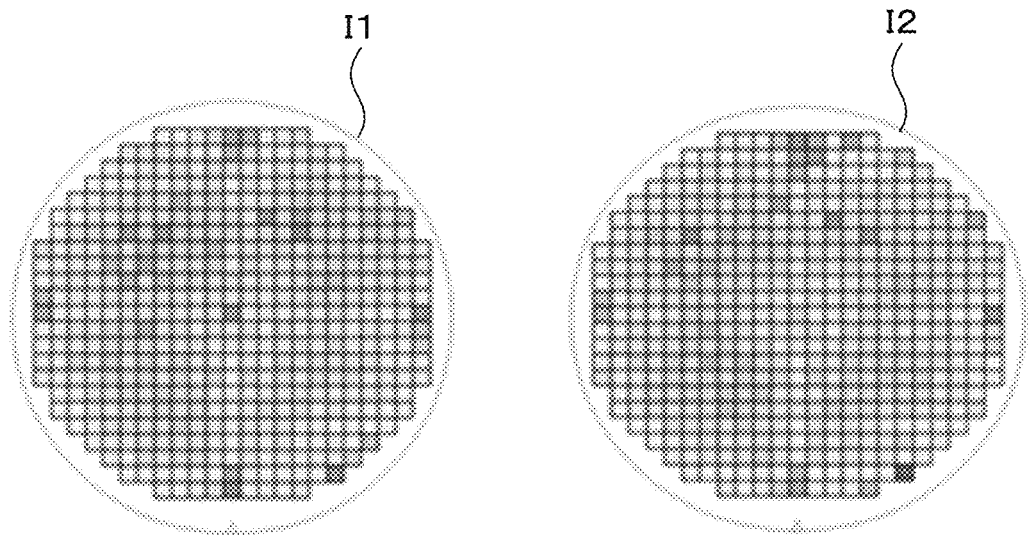
FIG. 11 is a view illustrating that there is a correlation between a line width of a resist pattern on a wafer and an imaging result using an imaging apparatus.
Figure 11:
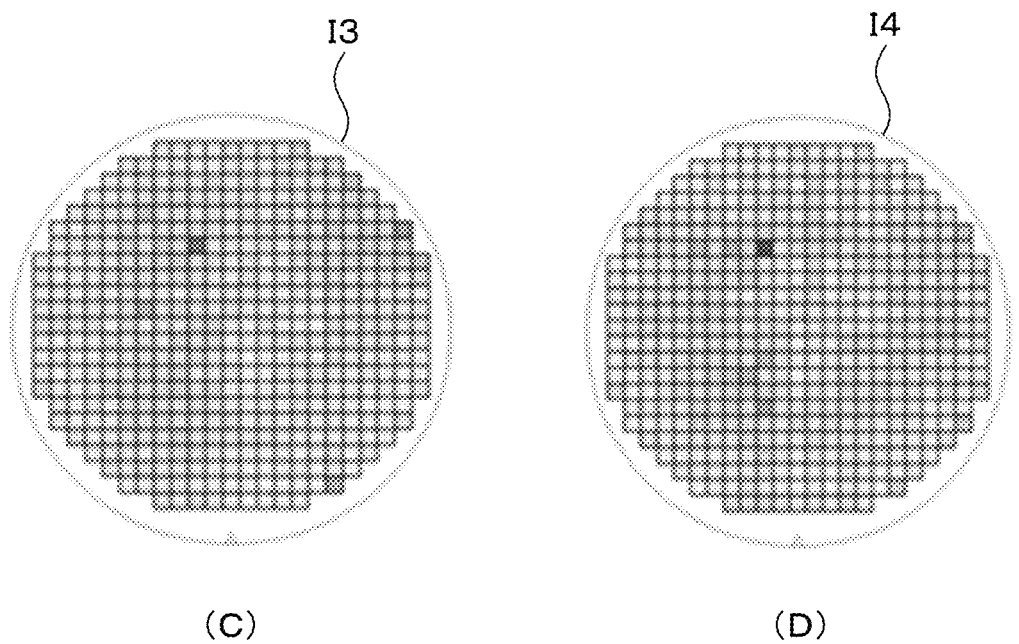

FIG. 11 is a view illustrating that there is a correlation between the line width of the resist pattern on the wafer W and an imaging result using the imaging apparatus 210 of the defect inspection apparatus 61. Note that in FIG. 11(A) to FIG. 11 (D), images I1 to I4 are displayed in gray scales but are actually color images.

The images I1, I3 in FIG. 11(A) and FIG. 11(C) are acquired as follows. Specifically, the wafer W is divided into 437 regions and, in each of the regions, the line width of the resist pattern on the region is measured by SEM and an average value of the line width is calculated for each of the regions. Further, the calculated average value of the line width is converted into RGB data. The RGB data is data containing pixel values/luminance values of R (red), G (green), B (blue). Then, for each of the regions, a table is created in which the coordinates of the region and the RGB data converted from the average value of the line width are associated with each other. Based on the table, the RGB images I1, I3 each indicating the distribution of the line width of the resist pattern as illustrated in FIG. 11(A) and FIG. 11(C) are acquired.

The images I2, I4 in FIG. 11(B) and FIG. 11(D) are acquired as follows. Specifically, the whole wafer W on which the resist patterns are formed is imaged using the imaging apparatus 210 of the defect inspection apparatus 61. Then, the wafer W is divided into 437 regions and, in each of the regions, an average value of the pixel values of R, G, B in pixels included in the region is calculated. Then, for each of the regions, a table is created in which the coordinates of the region and the average value of the pixel values, namely, the average value of the RGB data are associated with each other. Then, the table is calibrated according to the optical system or the like in the defect inspection apparatus 61. Based on the calibrated table, the RGB images I2, I4 as illustrated in FIG. 11(B) and FIG. 11(D) are acquired. Hereinbelow, the image acquired as explained above from the imaging result in the imaging apparatus 210 is referred to as a "captured image" unless otherwise stated.

Note that the treatment condition for the wafer W (including various treatment apparatuses used) is the same between FIG. 11(A) and FIG. 11(B) and is also the same between FIG. 11(C) and FIG. 11(D). However, the treatment condition for the wafer W is different between FIG. 11(A) and FIG. 11(C).

The color distribution is the same between the image I1 of FIG. 11(A) and the image I2 of FIG. 11(B), and the color distribution is also the same between the image I3 of FIG. 11(C) and the image I3 of FIG. 11(D). From the above, it is clear that there is a correlation between the information on color in the captured image indicating the state of the surface of the wafer W obtained from the imaging result using the imaging apparatus 210, namely, the RGB data and the line width of the resist pattern on the wafer W.

Hence, in this embodiment, the setting of the treatment temperature of the hot plate 142 at the time of the PEB treatment is performed based on the RGB data in the captured image.

Figure 12:
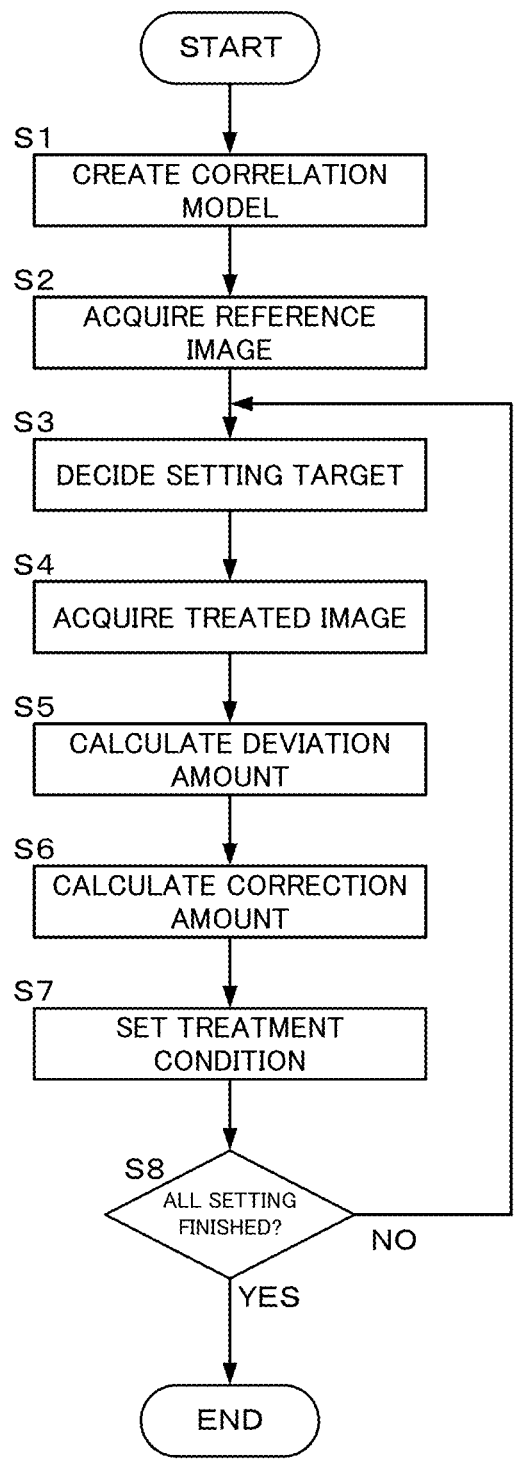
FIG. 12 is a flowchart for explaining an example of setting processing of a treatment temperature of the hot plate at the time of a PEB treatment.

Hereinafter, the setting processing of the treatment temperature of the hot plate 142 at the time of the PEB treatment according to this embodiment will be explained. FIG. 12 is a flowchart for explaining an example of the above setting processing.

<1. Correlation Model Creating Step>

In the above setting processing according to this embodiment, in order to use a correlation model indicating, for each of the hot plate regions R1 to R5, the correlation between the change amount in the RGB data in the captured image acquired from the imaging result using the imaging apparatus 210 and the change amount in the treatment temperature of the hot plate 142 as explained later, the correlation model is created first as illustrated in FIG. 12 (Step S1).

<1.1. Thermal Treatment Apparatus Deciding Step>

At the correlation model creating step, for example, a thermal treatment apparatus to be used for creating the correlation model among the plurality of thermal treatment apparatuses 40 for PEB treatment is decided according to the user input or the like.

<1.2. Pre-Resist Film Formation Inspecting Step>

Further, the wafer W for creating the correlation model is taken out of the cassette C on the cassette stage 12 and transferred to the defect inspection apparatus 61. Note that the wafer W for creating the correlation model is, for example, a bare wafer. Thereafter, the surface of the wafer W is imaged by the imaging apparatus 210, whereby a captured image is acquired. Note that when the RGB data in the captured image is not within a predetermined range, more specifically, when the luminance value of any of R, G, B in any of the regions of the captured image is not within the predetermined range, it is predicted that there is flaw or adhesion of foreign substance on the surface of the wafer W, and therefore the subsequent steps are not performed, and the wafer W is transferred out to the cassette C.

<1.3. Resist Film Formation and PAB Step>

At the pre-resist film formation inspecting step, when the RGB in the captured image is within the predetermined range and the wafer W has no problem, the wafer W is transferred to the resist coating apparatus 31, and a resist film is formed under the predetermined treatment condition. Thereafter, the wafer W is transferred to the thermal treatment apparatus 40 for PAB treatment and subjected to a thermal treatment under the predetermined treatment condition.

<1.4. Post-Resist Film Formation Inspecting Step>

Next, the wafer W is transferred to the defect inspection apparatus 61, and the wafer W on which the resist film has been formed is imaged by the imaging apparatus 210, whereby a captured image is acquired. Note that when the RGB data in the captured image is not within a predetermined range, specifically, when the luminance value of any of R, G, B in any of the regions of the captured image is not within the predetermined range, it is predicted that an appropriate resist film is not formed, and therefore the subsequent steps are not performed, and the wafer W is transferred out to the cassette C.

<1.5. Exposure Step>

At the post-resist film formation inspecting step, when the RGB data in the captured image is within the predetermined range and the resist film on the wafer W has no problem, the wafer W is transferred to the exposure apparatus 4, and subjected to exposure processing in a predetermined pattern.

<1.6. PEB Step>

Thereafter, the wafer W is transferred to the thermal treatment apparatus 40 for PEB treatment decided at the above thermal treatment apparatus deciding step and subjected to the PEB treatment under the initial set condition for creating the correlation model, namely, the PEB treatment is performed with the treatment temperature of the hot plate 142 set to an initial set temperature for creating the correlation model.

<1.7. Developing Step>

Next, the wafer W is transferred to the developing treatment apparatus 30 and subjected to a developing treatment.

<1.8. Imaging Step>

Next, the wafer W is transferred to the defect inspection apparatus 61, and the wafer W on which the resist patterns have been formed by the developing treatment is imaged by the imaging apparatus 210, whereby a captured image is acquired. Then, the wafer W is transferred to the cassette C on the cassette stage 12.

Thereafter, the above 1.2 to 1.8 steps are repeated a plurality of times. However, the steps are repeated the plurality of times in a manner that the treatment temperature of the hot plate 142 at the PEB step differs every time. Thus, a plurality of pieces of the information on the treatment temperature in each of the regions R1 to R5 of the hot plate 142 are acquired, and the captured image acquired at the above 1.8 imaging step is acquired after the PEB treatment is performed at each treatment temperature. Then, for each of the regions R1 to R5, a difference in the RGB data among the captured images and a difference among the treatment temperatures of the hot plate 142 at the time when the captured images are acquired, are calculated. From the calculation result, the correlation model is created which indicates, for each of the hot plate regions R1 to R5, the correlation between the change amount in the RGB data in the captured image acquired from the imaging result using the imaging apparatus 210 and the change amount in the treatment temperature of the hot plate 142. Note that the difference in the RGB data among the captured images of the hot plate region R1 used for the creation of the correlation model is, for example, a difference in the average value of the RGB data among the captured images contained in a position corresponding to the hot plate region R1, and can be calculated based on the above-explained table. The differences in the RGB data among the captured images of the hot plate regions R2 to R5 are the same.

As explained above, the PEB treatment is performed at the plurality of treatment temperatures in one of the plurality of thermal treatment apparatuses 40 for PEB, and the correlation model is created from the difference in the RGB data among the captured images based on the result of imaging, by the imaging apparatus 210, the substrate on which the PEB treatment has been performed at the treatment temperatures, and from the difference among the treatment temperatures when the captured images are acquired.

The explanation is returned to that of the setting processing of the treatment temperature of the hot plate 142 at the time of the PEB treatment.

<2. Reference Image Acquiring Step>

After the correlation model creating step, a wafer being a reference (hereinafter, a reference wafer) when setting the treatment temperature of each of the regions R1 to R5 of the hot plate 142 is imaged by the imaging apparatus 210 used for setting the treatment temperatures, whereby a captured image of the reference wafer is acquired (Step S2).

More specifically, the reference wafer is taken out of the cassette C on the cassette stage 12 and transferred to the defect inspection apparatus 61, and the surface of the reference wafer is imaged by the imaging apparatus 210, whereby a captured image of the reference wafer is acquired based on the imaging result.

The reference wafer is a wafer on which resist patterns with a desired line width are formed uniformly within the plane, and the wafer can be produced in advance based on a line width measurement result using SEM outside the substrate treatment system 1, and can be produced in another substrate treatment system 1 in which the treatment temperature has been appropriately set by the setting method according to this embodiment.

Note that the reference image acquiring step may be performed before the correlation model creating step, or may be performed in parallel with the correlation model creating step.

<3. Setting Target Deciding Step>

Further, among the plurality of thermal treatment apparatuses 40 for PEB treatment, the setting target one is decided according to the user input or the like. The setting target deciding step may be performed before the correlation model creating step and the reference image acquiring step, or may be performed in parallel with these steps.

<4. Treated Image Acquiring Step>

After the correlation model creating step, the reference image acquiring step, and the setting target deciding step, a captured image of the wafer W subjected to the PEB treatment in the thermal treatment apparatus 40 for PEB treatment which is the treatment temperature setting target is acquired. Specifically, the following 4.1 to 4.7 steps are performed.

<4.1. Pre-Resist Film Formation Inspecting Step>
<4.2. Resist Film Formation and PAB Step>
<4.3. Post-Resist Film Formation Inspecting Step>
<4.4. Exposure Step>

In the treated image acquiring step, the same processing as that at the above-explained 1.2 to 1.5 steps is performed on the wafer W for setting at the 4.1 to 4.4 steps. Thus, an appropriate resist film is formed on the wafer W for setting, and the resist film is subjected to exposure processing in a predetermined pattern. Note that the wafer W for setting is, for example, a bare wafer.

<4.5. PEB Step>

Thereafter, the wafer W is transferred to the thermal treatment apparatus 40 for PEB treatment which is the setting target decided at the above setting target deciding step and subjected to a PEB treatment at the treatment temperature currently set in the thermal treatment apparatus 40, namely, the PEB treatment is performed with the treatment temperatures of the regions R1 to R5 of the hot plate 142 set to initial set temperatures for setting.

<4.6. Developing Step>

Next, the wafer W subjected to the PEB treatment is transferred to the developing treatment apparatus 30 and subjected to a developing treatment.

<4.7. Imaging Step>

Next, the wafer W is transferred to the defect inspection apparatus 61. The wafer W which has been subjected to the PEB treatment at the initial set temperatures and on which the resist patterns have been formed by the developing treatment is imaged by the imaging apparatus 210, whereby a captured image (hereinafter, referred to as a captured image of the treated wafer W in some cases) is acquired. Then, the wafer W is transferred to the cassette C on the cassette stage 12.

<5. Deviation Amount Calculating Step>

If the initial set temperatures for setting are not appropriate, deviation occurs in the RGB data between the captured image of the reference wafer acquired at the reference image acquiring step and the captured image of the treated wafer W acquired at the treated image acquiring step, and therefore the deviation amount in the RGB data is calculated (Step S5).

Specifically, for example, for each of the regions of the hot plate 142, a difference between an average value of the RGB data on the captured image of the reference wafer included in the region and an average value of the RGB data on the captured image of the treated wafer W included in the region is calculated as the deviation amount in the RGB data.

<6. Correction Amount Calculating Step>

Then, based on the correlation model created at the correlation model creating step and the deviation amount in the RGB data, a correction amount of the treatment temperature in each of the regions R1 to R5 of the hot plate 142 is calculated (Step S6). As the correction amount, the one which causes no difference in the RGB data between the captured image of the wafer W subjected to the PEB treatment after the treatment temperature is corrected based on the correction amount and the captured image of the reference wafer is calculated.

<7. Treatment Condition Setting Step>

Next, the initial set temperature for setting currently set for each of the regions R1 to R5 of the hot plate 142 is corrected based on the calculated correction amount, and the treatment temperature in each of the regions R1 to R5 of the hot plate 142 in the thermal treatment apparatus 40 being the setting target is set to the temperature after the correction (Step S7).

Then, for all of the thermal treatment apparatuses 40 for PEB treatment, whether the setting of the treatment temperature has been finished is determined (Step S8), and when not finished (in the case of NO), Step S3 to Step S7 are repeated. On the other hand, when finished at Step S8 (in the case of YES), the setting processing is finished.

In other words, until the setting of the treatment temperature is completed for all of the thermal treatment apparatuses 40 for PEB treatment, the treated image acquiring step, the deviation amount calculating step, the correction amount calculating step, and the treatment condition setting step are performed for each of the thermal treatment apparatuses 40.

This makes it possible to obtain resist patterns with a desired line width on the wafer without measuring the line width of the resist patterns, and to reduce the difference in line width among the thermal treatment apparatuses 40, namely, the difference in line width among wafers and the variation in line width within the plane.

Further, the setting of the treatment temperature of the hot plate 142 for optimizing the line width of the resist pattern is made based on the captured image without using the measurement result by SEM in the method of setting the treatment temperature in this embodiment, so that even when there are a plurality of thermal treatment apparatuses 40 being the setting targets, the setting can be completed in a short time.

Note that in the above, the treatment temperature in each of the regions R1 to R5 of the hot plate in the thermal treatment apparatus 40 used for the PEB treatment is exemplified as the treatment condition in the substrate treatment system 1 affecting the line width of the resist pattern, and the treatment temperature is set. However, the method of setting the treatment condition according to this embodiment is also applicable to the setting of other treatment conditions (for example, the developing treatment condition in the delivery apparatus 30) in the substrate treatment system 1 affecting the line width of the resist pattern.

Subsequently, processing of setting the treatment condition in the substrate treatment system 1, specifically, processing of setting the treatment rotation number of the wafer W in the resist coating apparatus 31 and the treatment temperature in each of the regions R1 to R5 of the hot plate 142 at the time of the PAB treatment for forming a resist film uniform and having a desired film thickness within the plane of the wafer W in introducing the substrate treatment system 1 will be explained.

Also in the above processing of setting the treatment condition according to this embodiment, the captured image based on the imaging result by the imaging apparatus 210 of the defect inspection apparatus 61 is used. This is because there is a correlation between the film thickness of the resist film and the RGB data in the captured image.

Note that in the following example, the substrate treatment system 1 includes the resist coating apparatus 31 and the thermal treatment apparatus 40 for PAB treatment three each, and the three resist coating apparatuses 31 are described as first to third resist coating apparatuses 31 and the three thermal treatment apparatuses 40 for PAB treatment are described as first to third thermal treatment apparatuses 40 for convenience of explanation.

<11. Correlation Model Creating Step>

In the processing of setting two treatment conditions such as the treatment rotation number of the wafer W in the resist coating apparatus 31 and the treatment temperature in each of the regions R1 to R5 of the hot plate 142 at the time of the PAB treatment, a correlation model similar to the above is used, and therefore the correlation model is created for each of the treatment conditions.

[Creation of the Correlation Model for Setting the Treatment Rotation Number of the Wafer W]

<11.1A. Treatment Apparatus Deciding Step>

In creating the correlation model for setting the treatment rotation number of the wafer W, a combination of the resist coating apparatus 31 and the thermal treatment apparatus 40 for PAB treatment used for creating the correlation model is decided according to the user input or the like from among the first to third resist coating apparatuses 31 and the first to third thermal treatment apparatuses 40 for PAB treatment.

<11.2A. Inspecting Step>

Further, the wafer W for creating the correlation model is taken out of the cassette C on the cassette stage 12 and transferred to the defect inspection apparatus 61. Thereafter, the surface of the wafer W is imaged by the imaging apparatus 210, whereby a captured image is acquired. Note that when the RGB data in the captured image is not within a predetermined range, it is predicted that there is flaw or adhesion of foreign substance on the surface of the wafer W, and therefore the subsequent steps are not performed, and the wafer W is transferred out to the cassette C.

<11.3A. Resist Film Forming Step>

At the inspecting step, when the RGB in the captured image is within the predetermined range and the wafer W has no problem, the wafer W is transferred to the resist coating apparatus 31 selected at the above treatment apparatus deciding step, and a resist film is formed under the initial set condition for creating the correlation model.

<11.4A. PAB Treatment Step>

Thereafter, the wafer W is transferred to the thermal treatment apparatus 40 for PAB treatment and subjected to a thermal treatment under the predetermined treatment condition.

<11.5A. Imaging Step>

Next, the wafer W is transferred to the defect inspection apparatus 61 and the wafer W is imaged by the imaging apparatus 210, whereby a captured image is acquired. Then, the wafer W is transferred to the cassette C on the cassette stage 12.

Thereafter, the above 11.2A to 11.5A steps are repeated a plurality of times. However, the steps are repeated the plurality of times in a manner that the treatment rotation speed of the wafer W at the resist film step differs every time. Thus, a plurality of pieces of the information on the treatment rotation speed of the wafer W are acquired, and the captured image acquired at the above 11.5A imaging step is acquired after the treatment is performed at each treatment rotation number. Then, a difference in the RGB data among the captured images and a difference among the rotation numbers of the wafer W at the time when the captured images are acquired, are calculated. From the calculation result, the correlation model is created which indicates the change amount in the RGB data in the captured image acquired from the imaging result using the imaging apparatus 210 and the change amount in the treatment rotation speed of the wafer W. Note that the difference in the RGB data among the captured images used for the creation of the correlation model is, for example, a difference in the average value of the RGB data among the captured images of the whole wafer W, and can be calculated based on the above-explained table.

[Creation of the Correlation Model for Setting the Treatment Temperature of the Hot Plate 142 at the Time of the PAB Treatment]

<11.1B. Treatment Apparatus Deciding Step>

In creating the correlation model for setting the treatment temperature of the hot plate 142 at the time of the PAB treatment, a combination of the resist coating apparatus 31 and the thermal treatment apparatus 40 for PAB treatment used for creating the correlation model is decided according to the user input or the like from among the first to third resist coating apparatuses 31 and the first to third thermal treatment apparatuses 40 for PAB treatment. Note that this step can be omitted in the case of using, as the above combination, the same combination as that in creating the correlation model for setting the treatment rotation number of the wafer W.

<11.2B. Inspecting Step>

Further, the wafer W for creating the correlation model is taken out of the cassette C on the cassette stage 12 and transferred to the defect inspection apparatus 61. The same inspection as that at 11.2A is performed.

<11.3B. Resist Film Forming Step>

At the inspecting step, when the wafer W has no problem, the wafer W is transferred to the resist coating apparatus 31 selected at the above treatment apparatus deciding step, and a resist film is formed under the predetermined treatment condition.

<11.4B. PAB Treatment Step>

Thereafter, the wafer W is transferred to the thermal treatment apparatus 40 for PAB treatment and subjected to a PAB treatment under the initial set condition for creating the correlation model.

<11.5B. Imaging Step>

Next, the wafer W is transferred to the defect inspection apparatus 61 and the wafer W is imaged by the imaging apparatus 210, whereby a captured image is acquired. Then, the wafer W is transferred to the cassette C on the cassette stage 12.

Thereafter, the above 11.2B to 11.5B steps are repeated a plurality of times. However, the steps are repeated the plurality of times in a manner that the treatment temperature of the hot plate 142 at the PAB step differs every time. Thus, a plurality of pieces of the information on the treatment temperature in each of the regions R1 to R5 of the hot plate 142 are acquired, and the captured image acquired at the above 11.5B imaging step is acquired after the PAB treatment is performed at each treatment temperature. Then, for each of the regions R1 to R5, a difference in the RGB data among the captured images and a difference among the treatment temperatures of the hot plate 142 at the time when the captured images are acquired, are calculated. From the calculation result, the correlation model is created which indicates, for each of the hot plate regions R1 to R5, the correlation between the change amount in the RGB data in the captured image acquired from the imaging result using the imaging apparatus 210 and the change amount in the treatment temperature of the hot plate 142.

The explanation is returned to the explanation of the processing of setting two treatment conditions such as the treatment rotation number of the wafer W in the resist coating apparatus 31 and the treatment temperature in each of the regions R1 to R5 of the hot plate 142 at the time of the PAB treatment.

<12. Reference Image Acquiring Step>

After the correlation model creating step, a wafer being a reference wafer (hereinafter, referred to as a reference wafer) when setting the two treatment conditions is imaged by the imaging apparatus 210 used for setting the treatment temperature, whereby a captured image of the reference wafer is acquired.

The reference wafer in this example is a wafer on which a resist film having a desired film thickness and a film thickness uniform within the plane is formed, and this wafer can be produced in advance, for example, based on the film thickness measurement result using the cross section SEM outside the substrate treatment system 1, and can be produced in another substrate treatment system 1 in which the treatment conditions have been appropriately set by the setting method according to this embodiment.

Note that the reference image acquiring step may be performed before the correlation model creating step or may be performed in parallel with the correlation model creating step.

In the setting processing according to this embodiment, starting from one of an apparatus group composed of the first to third resist coating apparatuses 31 and an apparatus group composed of the first to third thermal treatment apparatuses 40, the treatment condition in the apparatus is set. Hereinafter, the setting is assumed to be made first for the apparatus group composed of the first to third resist coating apparatuses 31. However, the setting may be made first for the apparatus group composed of the first to third thermal treatment apparatuses 40.

[Resist Coating Apparatus Treatment Condition Setting]

<13A. Thermal Treatment Apparatus Deciding Step>

In setting the treatment condition in the first to third resist coating apparatuses 31, the thermal treatment apparatus 40 for PAB common to the resist coating apparatuses 31 is selected/decided according to the user input or the like from among the first to third thermal treatment apparatuses 40. The reason why the common thermal treatment apparatus 40 is decided here is as follows. Specifically, unless the thermal treatment apparatus 40 for PAB treatment is common to the resist coating apparatuses 31, if deviation occurs in the RGB data between the captured image of the reference wafer and a captured image acquired at a later-explained imaging step, it cannot be determined whether the deviation results from that the treatment condition of the resist coating apparatus 31 is not appropriate or from that the thermal treatment apparatus 40 differs.

This thermal treatment apparatus deciding step may be performed before the correlation model creating step or the reference image acquiring step, or may be performed in parallel with these steps.

<14A. Setting Target Deciding Step>

Further, among the first to third resist coating apparatuses 31, the setting target one is decided according to the user input or the like. The setting target deciding step may be performed before the correlation model creating step, the reference image acquiring step, or the thermal treatment apparatus deciding step, or may be performed in parallel with the correlation model creating step and the reference image acquiring step.

<15A. Treated Image Acquiring Step>

Then, a captured image of the wafer W subjected to the resist film forming treatment in the resist coating apparatus 31 decided at the setting target deciding step and subjected to the PAB treatment in the thermal treatment apparatus 40 for PAB treatment decided at the thermal treatment apparatus deciding step, is acquired. Specifically, the following 15.1A to 15.4A steps are performed.

<15.1A. Inspecting Step>

At the treated image acquiring step, the same inspection as that at 11.2A is performed on the wafer for setting. Note that the wafer W for setting is, for example, a bare wafer.

<15.2A. Resist Film Forming Step>

When the wafer W has no problem at the inspecting step, the wafer W is transferred to the resist coating apparatus 31 being the setting target decided at the above setting target deciding step. Then, the resist film forming treatment is performed at the treatment rotation speed of the wafer W currently set in the resist coating apparatus 31, namely, the resist film forming treatment is performed with the treatment rotation speed of the wafer W set to the initial set speed for setting.

<15.3A. PAB Treatment Step>

Thereafter, the wafer W is transferred to the thermal treatment apparatus 40 for PAB treatment decided at the thermal treatment apparatus deciding step, and subjected to a PAB treatment in the thermal treatment apparatus 40 under the predetermined treatment condition.

<15.4A. Imaging Step>

Next, the wafer W is transferred to the defect inspection apparatus 61 and the wafer W is imaged by the imaging apparatus 210, whereby a captured image is acquired. Then, the wafer W is transferred to the cassette C on the cassette stage 12.

<16A. Deviation Amount Calculating Step>

If the initial set speed for setting is not appropriate, deviation occurs in the RGB data between the captured image of the reference wafer acquired at the reference image acquiring step and the captured image of the treated wafer W acquired at the treated image acquiring step, and therefore the deviation amount in the RGB data is calculated.

Specifically, for example, a difference between an average value of the RGB data on the whole wafer in the captured image of the reference wafer and an average value of the RGB data on the whole wafer in the captured image of the treated wafer W is calculated as the deviation amount in the RGB data.

<17A. Correction Amount Calculating Step>

Then, based on the correlation model created at the correlation model creating step and the deviation amount in the RGB data, a correction amount of the treatment rotation speed of the wafer W in the resist coating apparatus 31 is calculated (Step S6). As the correction amount, the one which causes no difference in the RGB data between the captured image of the wafer W subjected to the resist film forming treatment with the treatment rotation speed corrected based on the correction amount and the captured image of the reference wafer is calculated.

<18A. Treatment Condition Setting Step>

Next, the initial set speed for setting currently set as the treatment rotation speed of the wafer W is corrected based on the calculated correction amount, and the treatment rotation speed of the wafer W in the resist coating apparatus 31 being the setting target is set to the speed after the correction.

Then, until the setting of the treatment rotation speed is completed for all of the first to third resist coating apparatuses 31, the treated image acquiring step, the deviation amount calculating step, the correction amount calculating step, and the treatment condition setting step are performed for each of the resist coating apparatuses 31.

[Thermal Treatment Apparatus for PAB Treatment Condition Setting]

<13B. Resist Coating Apparatus Deciding Step>

In setting the treatment condition in the first to third thermal treatment apparatuses 40, the resist coating apparatuses 31 common to the thermal treatment apparatuses 40 is selected/decided according to the user input or the like from among the first to third resist coating apparatuses 31.

This thermal treatment apparatus deciding step may be performed before the correlation model creating step or the reference image acquiring step, or may be performed in parallel with these steps.

<14B. Setting Target Deciding Step>

Further, among the first to third thermal treatment apparatuses 40, the setting target one is decided according to the user input or the like. The setting target deciding step may be performed before the correlation model creating step, the reference image acquiring step, or the resist coating apparatus deciding step, or may be performed in parallel with the correlation model creating step and the reference image acquiring step.

<15B. Treated Image Acquiring Step>

Then, a captured image of the wafer W subjected to the resist film forming treatment in the resist coating apparatus 31 decided at the resist coating apparatus deciding step and subjected to the PAB treatment in the thermal treatment apparatus 40 for PAB treatment decided at the setting target deciding step, is acquired. Specifically, the following 15.1B to 15.4B steps are performed.

<15.1B. Inspecting Step>

At the treated image acquiring step, the same inspection as that at 11.2A is performed on the wafer for setting. Note that the wafer W for setting is, for example, a bare wafer.

<15.2B. Resist Film Forming Step>

When the wafer W has no problem at the inspecting step, the wafer W is transferred to the resist coating apparatus 31 decided at the resist coating apparatus deciding step, and the resist film forming treatment is performed at predetermined treatment condition in the resist coating apparatus 31.

<15.3B. PAB Treatment Step>

Thereafter, the wafer W is transferred to the thermal treatment apparatus 40 for PAB treatment decided at the setting target deciding step, and subjected to a PAB treatment at the currently set treatment temperature in the thermal treatment apparatus 40, namely, the PAB treatment is performed with the treatment temperatures in the regions R1 to R5 of the hot plate 142 set to the respective initial set temperatures for setting.

<15.4B. Imaging Step>

Next, the wafer W is transferred to the defect inspection apparatus 61 and the wafer W is imaged by the imaging apparatus 210, whereby a captured image is acquired. Then, the wafer W is transferred to the cassette C on the cassette stage 12.

<16B. Deviation Amount Calculating Step>
<17B. Correction Amount Calculating Step>
<18B. Treatment Condition Setting Step>

After the treated image acquiring step, similar processing at the above 5 to 7 steps at the treatment temperature setting step at the time of the PEB treatment is performed at 16B to 18B steps. Thus, the treatment temperature in each of the regions R1 to R5 of the hot plate 142 in the thermal treatment apparatus 40 for PAB treatment decided at the setting target deciding step is set.

Then, until the setting of the treatment temperature in each of the regions of the hot plate 142 is completed for all of the first to third thermal treatment apparatuses 40, the treated image acquiring step, the deviation amount calculating step, the correction amount calculating step, and the treatment condition setting step are performed for each of the thermal treatment apparatuses 40.

Setting the treatment rotation speed of the wafer W in the resist coating apparatus 31 and the treatment temperature in each of the regions R1 to R5 of the hot plate 142 in the thermal treatment apparatus 40 for PAB treatment as in the above manner makes it possible to form on the wafer a resist film having a desired film thickness and a film thickness uniform within the plane without measuring the film thickness of the resist film. Further, the excellent resist film can be formed irrespective of the resist coating apparatus 31 and the thermal treatment apparatus 40 which are used for the resist film formation.

Further, in the method of setting the treatment condition in this embodiment, the setting of the treatment condition is made based on the captured image without using the measurement result using the cross section SEM, so that even when there are a plurality of resist coating apparatuses 31 and thermal treatment apparatuses 40 being the setting targets, the setting can be completed in a short time.

Note that the treatment rotation speed of the wafer W in the resist coating apparatus 31 and the treatment temperature in each of the regions R1 to R5 of the hot plate 142 in the thermal treatment apparatus 40 for PAB treatment are exemplified as the treatment conditions in the substrate treatment system 1 affecting the film thickness of the resist film in the above, and the treatment conditions are set. However, the method of setting the treatment condition according to this embodiment is also applicable to setting of another treatment condition (for example, a rotation time of the wafer W in the resist coating apparatus 31) in the substrate treatment system 1 affecting the film thickness of the resist film.

Further, the RGB data on the captured image is used assuming that there is a correlation with the line width of the resist pattern and the film thickness of the resist film in the above explanation, but the color information having a correlation with the line width of the resist pattern and the film thickness of the resist film is not limited to the RGB data. Note that the color information means luminance information on light having a specific wavelength The above color information may be luminance information on one color of R, G, B or may be luminance information on a color other than, R, G, B.

Note that the treatment condition is set using the above-explained correlation model in introducing the substrate treatment system 1 in the above but, also in mass production, whether a difference occurs between the color information on the captured image of the wafer after a predetermined treatment and the color information on the captured image being a reference is observed, and when the difference occurs, the treatment condition may be subjected to feedback control using the same correlation model.

Furthermore, the luminance information on light rays having a plurality of wavelengths contained in the visible light range may be acquired for each pixel in the imaging apparatus in the substrate treatment system 1, and the treatment condition may be set using the luminance information on the light having a wavelength selected from among the plurality of wavelengths, namely, a color.

In other words, the setting treatment of the treatment condition according to this embodiment may include a selecting step of selecting the color for the color information, namely, the wavelength of light used for setting. When the material used for forming the resist film is changed, the wavelength of reflected light from the resist film changes, a color largely changing in the luminance information with respect to the change amount in the line width of the resist pattern and the film thickness of the resist film, namely, the wavelength of the reflected light changes. Including the above selecting step enables selection of the color largely changing in the luminance information with respect to the change amount in the line width of the resist pattern and the film thickness of the resist film, namely, the wavelength of the light. Accordingly, the setting of the treatment condition based on the color information on the developed image can be more accurately made.

Note that the treatment condition may be set using the luminance information on light outside the visible light range (for example, light in an infrared range).

Figure 13:
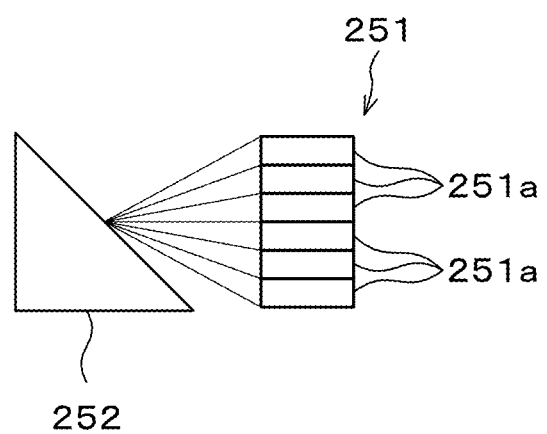
FIG. 13 is a view for explaining another example of the imaging apparatus provided in the substrate treatment system.

FIG. 13 is a view for explaining another example of the imaging apparatus provided in the substrate treatment system 1.

The imaging apparatus provided in the substrate treatment system 1 is provided with one prism 252 in front of each pixel 251 as illustrated in FIG. 13, and a light ray reaching one pixel 251 has been split by the prism 252. Further, the pixel 251 is divided into a plurality of light receivers 251a corresponding to the split light rays made by the prism 252, and the light rays of wavelengths split by the prism 252 are separately received by the light receivers 251a. Accordingly, in the imaging apparatus in this example, the luminance information on the light rays of a plurality of wavelengths can be acquired by each pixel.

Second Embodiment

Figure 14:
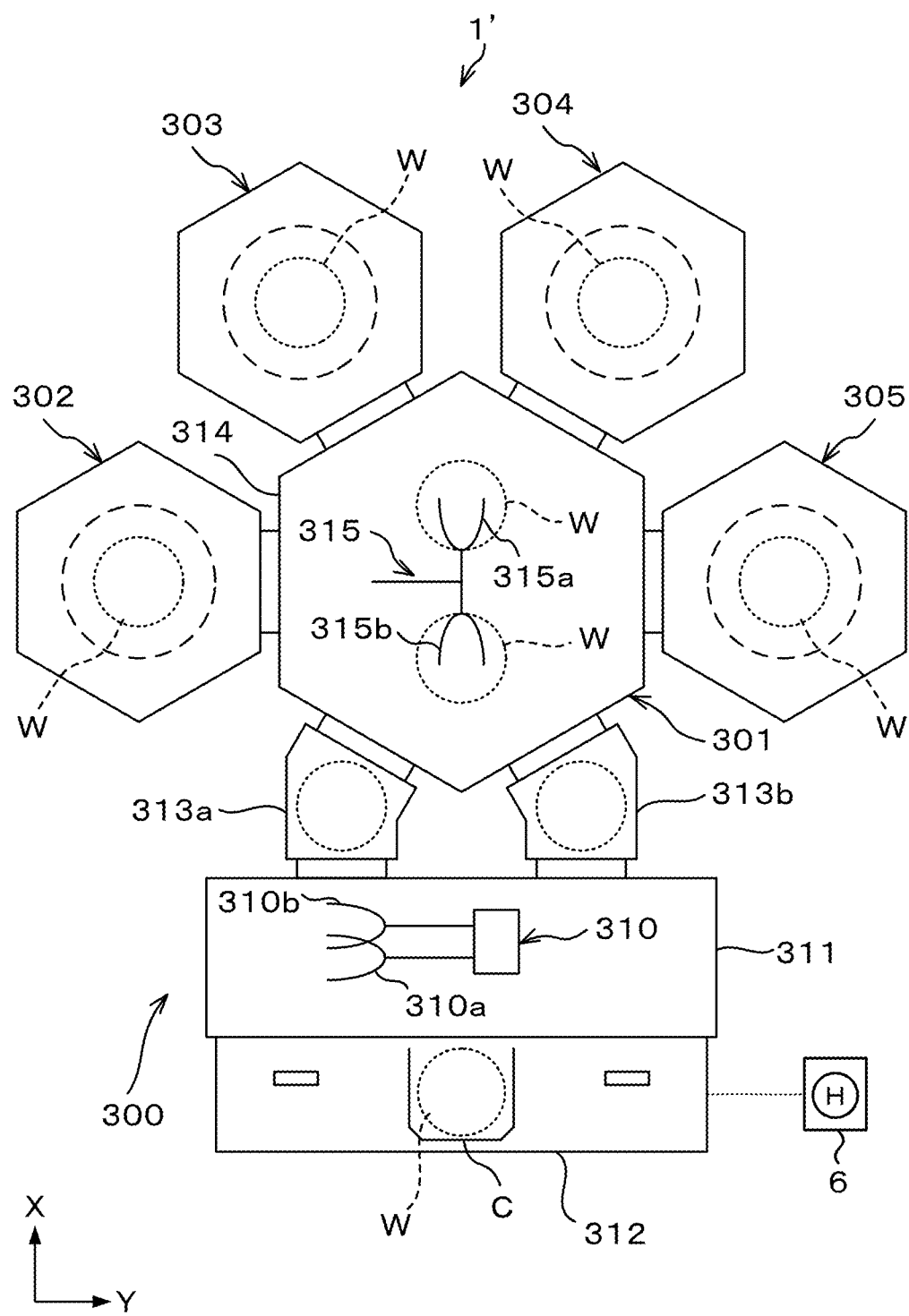
FIG. 14 is a plan view illustrating the outline of the configuration of a substrate treatment system according to a second embodiment of the present invention.

FIG. 14 is a plan view schematically illustrating the outline of the configuration of a substrate treatment system 1' according to a second embodiment.

The substrate treatment system 1 according to the first embodiment is constituted as the coating and developing system in which the PEB treatment, the resist film forming treatment, and the PAB treatment and so on are performed, whereas in the substrate treatment system 1' according to the second embodiment, a film forming treatment for forming a predetermined film such as a TiN film on the wafer W, an etching treatment on the wafer W, and so on are performed.

The substrate treatment system 1' includes, as illustrated in FIG. 14, a cassette station 300 to/from which a cassette C housing a plurality of wafers W is transferred in/out, a common transfer section 301 which transfers the wafer W, a TiN film forming apparatus 302 which forms a TiN film on the wafer W, a spacer film forming apparatus 303 which forms a spacer film on the wafer W, an etching apparatus 304 which etches the predetermined film on the wafer W, an imaging apparatus 305 which images the surface of the wafer W, and a controller 6 which controls the substrate treatment system F.

Each of the TiN film forming apparatus 302 and the spacer film forming apparatus 303 is, for example, a CVD (Chemical Vapor Deposition) apparatus using plasma. For the etching apparatus 304, an RIE (Reactive Ion Etching) apparatus is used. Note that for the TiN film forming apparatus 302, the spacer film forming apparatus 303, and the etching apparatus 304, publicly-known apparatuses can be used respectively. Besides, for the imaging apparatus 305, the one similar to the above-explained imaging apparatus 210 can be used.

The cassette station 300 has a transfer room 311 in which a wafer transfer apparatus 310 transferring the wafer W is provided. The wafer transfer apparatus 310 has two transfer arms 310a, 310b each of which substantially horizontally holds the wafer W, and is configured to transfer the wafer W while holding the wafer W by one of the transfer arms 310a, 310b. Beside the transfer room 311, a cassette stage 312 is provided on which a cassette C capable of housing a plurality of wafers W lined up is mounted. In the illustrated example, a plurality of, for example, three cassettes C can be mounted on the cassette stage 312.

The transfer room 311 and the common transfer section 301 are coupled to each other via two load-lock apparatuses 313a, 313b which can be evacuated.

The common transfer section 301 has a transfer room chamber 314 having a hermetically closable structure formed in a substantially polygonal shape (a hexagonal shape in the illustrated example) as viewed from above. In the transfer room chamber 314, a wafer transfer apparatus 315 which transfers the wafer W is provided. The wafer transfer apparatus 315 has two transfer arms 315a, 315b each of which substantially horizontally holds the wafer W, and is configured to transfer the wafer W while holding the wafer W by one of the transfer arms 315a, 315b.

Outside the transfer room chamber 314, the TiN film forming apparatus 302, the spacer film forming apparatus 303, the etching apparatus 304, the imaging apparatus 305, and the load-lock apparatuses 313b, 313a are arranged to surround the periphery of the transfer room chamber 314. The TiN film forming apparatus 302, the spacer film forming apparatus 303, the etching apparatus 304, the imaging apparatus 305, and the load-lock apparatuses 313b, 313a are arranged to line up in this order, for example, in the clockwise direction as viewed from above, and to face six side surface portions of the transfer room chamber 314, respectively.

The method of setting the treatment condition according to the present invention can be used for setting the treatment condition of a film forming treatment of forming a predetermined film such as a TiN film on the wafer W and for setting the treatment condition of a treatment of etching the wafer W in the substrate treatment system F. Further, the method of setting the treatment condition can be used also for setting the treatment condition of a treatment of etching the predetermined film formed on a substrate.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention.

INDUSTRIAL APPLICABILITY

The present invention is useful for a technique of setting a treatment condition in a substrate treatment system which performs various treatments on a wafer.

EXPLANATION OF CODES 1, 1' substrate treatment system
6 controller
30, 305 developing treatment apparatus
31 resist coating apparatus
40 thermal treatment apparatus
41 edge exposure apparatus
61 defect inspection apparatus
142 hot plate
210 imaging apparatus

What is claimed is:
1. A treatment condition setting method of setting a treatment condition of a predetermined treatment in a substrate treatment system, the substrate treatment system comprising a treatment apparatus configured to perform the predetermined treatment on a substrate,
the substrate treatment system comprising an imaging apparatus configured to image a surface side of the substrate,
the treatment condition setting method comprising:
imaging, by the imaging apparatus, a reference substrate being a substrate which is a reference for setting the treatment condition and acquiring a captured image of the reference substrate based on an imaging result observed from the reference substrate, wherein the reference substrate is formed with a film having a line width or thickness;
imaging, by the imaging apparatus, a treated substrate being a substrate on which the predetermined treatment has been performed on a predetermined film on the treated substrate, under a current treatment condition and acquiring a captured image of the treated substrate based on an imaging result observed from the treated substrate,
wherein the predetermined treatment is:
a treatment of heating the substrate after exposure of a pattern is performed on a resist film as the predetermined film on the substrate, a treatment of supplying a coating solution to the substrate while rotating the substrate to form a coating film as the predetermined film, a treatment of heating the substrate after the coating film as the predetermined film is formed on the substrate, a treatment of forming the predetermined film on the substrate, or a treatment of etching the substrate formed with the predetermined film or etching the predetermined film on the substrate;
calculating a deviation amount in color information between the captured image of the treated substrate and the captured image of the reference substrate, wherein the color information is correlated with a predetermined line width or predetermined thickness of the predetermined film;
calculating a correction amount of the treatment condition of the predetermined treatment based on a correlation model indicating a correlation between a change amount in the color information in the captured image of the treated substrate based on the imaging result observed from the treated substrate by the imaging apparatus and a change amount in the treatment condition and on the deviation amount in the color information;

setting the treatment condition of the predetermined treatment based on the calculated correction amount and on the current treatment condition; and performing, by the treatment apparatus, the predetermined treatment on a target substrate based on the treatment condition set by the setting.

2. The treatment condition setting method according to claim 1, further comprising performing the predetermined treatment under a plurality of treatment conditions in the treatment apparatus, and creating the correlation model from a difference in the color information among captured images based on results of imaging, by the imaging apparatus, the treated substrate on which the predetermined treatment has been performed on the treatment conditions and from a difference among the treatment conditions when the captured images are acquired.

3. The treatment condition setting method according to claim 1, further comprising selecting a color for the color information.

4. The treatment condition setting method according to claim 1, wherein the reference substrate is formed based on a line width measurement result or film thickness measurement result using a measurement apparatus outside the substrate treatment system, and wherein the reference substrate is obtained without using the measurement apparatus and with using the imaging apparatus.

5. The treatment condition setting method according to claim 1, wherein the calculating of the correction amount is calculating, based on the correlation model and the deviation amount in the color information, the correction amount which causes no deviation amount in color information between the captured image of the treated substrate and the captured image of the reference substrate.

6. The treatment condition setting method according to claim 1, further comprising wherein the substrate treatment system comprises a plurality of the treatment apparatuses, and wherein the acquiring of the captured image of the treated substrate, the calculating of the deviation amount, the calculating of the correction amount, and the setting are performed for each of the treatment apparatuses.

* * * * *